US008692539B2

(12) United States Patent  (10) Patent No.: US 8,692,539 B2
Bjørn  (45) Date of Patent: Apr. 8, 2014

(54) FARADAY EFFECT CURRENT SENSOR

(75) Inventor: Lars Nørgaard Bjørn, Rønde (DK)

(73) Assignee: Powersense A/S, Holte (DK)

( * ) Notice: Subject to any disclaimer, the term of this patent is extended or adjusted under 35 U.S.C. 154(b) by 881 days.

(21) Appl. No.: 12/312,864

(22) PCT Filed: Nov. 30, 2007

(86) PCT No.: PCT/EP2007/063101
§ 371 (c)(1),
(2), (4) Date: Jun. 11, 2010

(87) PCT Pub. No.: WO2008/065196
PCT Pub. Date: Jun. 5, 2008

(65) Prior Publication Data
US 2010/0271004 A1 Oct. 28, 2010

(30) Foreign Application Priority Data

Nov. 30, 2006 (DK) .................................. 2006 01578

(51) Int. Cl.
G01R 31/00 (2006.01)
G01R 19/00 (2006.01)
G01R 31/28 (2006.01)

(52) U.S. Cl.
USPC .......................................................... 324/96

(58) Field of Classification Search
None
See application file for complete search history.

(56) References Cited

U.S. PATENT DOCUMENTS 3,411,069 A 11/1968 Kubler et al.
3,486,112 A 12/1969 Bayer
3,614,568 A 10/1971 Pesis et al.
3,675,125 A 7/1972 Jaecklin
3,980,949 A 9/1976 Feldtkeller
4,002,975 A 1/1977 Erickson et al.
4,253,061 A 2/1981 Ono et al.
4,269,483 A 5/1981 Feldtkeller (Continued)

FOREIGN PATENT DOCUMENTS

CA 2289736 9/1998
DE 196 23 810 7/1997

(Continued)

OTHER PUBLICATIONS

Kaj Iwansson et al., "Handbook of Sensors and Actuators 7", *Elsevier*, Amsterdam, NL, Ch. 2, "Measuring Current, Voltage and Power", p. 102 (1999).

(Continued)

*Primary Examiner* — Jermele M Hollington
*Assistant Examiner* — Trung Nguyen
(74) *Attorney, Agent, or Firm* — Klein, O'Neill & Singh, LLP

(57) ABSTRACT

The present invention relates to a Faraday sensor assembly comprising a first light guiding element adapted to guide electromagnetic radiation along a first propagation direction, and a second light guiding element adapted to guide electromagnetic radiation along a second propagation direction, the second propagation direction being essentially oppositely arranged relative to the first propagation direction. The Faraday sensor assembly further comprises a measurement region arranged between the first and second light guiding elements, the measurement region being adapted to receive an electrically conducting element having, in the measurement region, its primary extension direction in a direction being essentially perpendicular to the first and second propagation directions. The present invention further relates to methods and systems for stabilizing output signal from the sensors, and to methods and systems for processing signals from the sensor assembly.

21 Claims, 18 Drawing Sheets

(56) References Cited

U.S. PATENT DOCUMENTS

| | | |
|---|---|---|
| 4,531,810 A | 7/1985 | Carlsen |
| 4,540,937 A | 9/1985 | Asars |
| 4,564,754 A | 1/1986 | Sato et al. |
| 4,650,971 A | 3/1987 | Manecci et al. |
| 4,683,421 A | 7/1987 | Miller et al. |
| 4,683,513 A | 7/1987 | Miller |
| 4,694,243 A | 9/1987 | Miller et al. |
| 4,797,607 A | 1/1989 | Dupraz |
| 4,894,608 A | 1/1990 | Ulmer, Jr. |
| 4,947,107 A | 8/1990 | Doerfler et al. |
| 4,999,571 A | 3/1991 | Ishiko et al. |
| 5,021,647 A | 6/1991 | Tatsuno et al. |
| 5,029,273 A | 7/1991 | Jaeger |
| 5,051,577 A | 9/1991 | Lutz et al. |
| 5,057,769 A | 10/1991 | Edwards |
| 5,136,236 A | 8/1992 | Bohnert et al. |
| 5,182,547 A | 1/1993 | Griffith |
| 5,202,621 A | 4/1993 | Reischer |
| 5,386,290 A | 1/1995 | Okada |
| 5,451,863 A | 9/1995 | Freeman |
| 5,473,244 A | 12/1995 | Libove et al. |
| 5,486,754 A | 1/1996 | Cruden et al. |
| 5,552,979 A | 9/1996 | Gu et al. |
| 5,563,506 A | 10/1996 | Fielden et al. |
| 5,635,831 A | 6/1997 | Englund |
| 5,811,964 A | 9/1998 | Bosselmann et al. |
| 5,850,140 A | 12/1998 | Tokano et al. |
| 5,994,890 A | 11/1999 | Kajiwara et al. |
| 6,025,980 A | 2/2000 | Morron et al. |
| 6,043,648 A | 3/2000 | Menke et al. |
| 6,285,182 B1 | 9/2001 | Blake et al. |
| 6,307,666 B1 | 10/2001 | Davidson et al. |
| 6,349,165 B1 | 2/2002 | Lock |
| 6,353,494 B1 | 3/2002 | Hamada |
| 6,380,725 B1 | 4/2002 | Chavez et al. |
| 6,388,434 B1 | 5/2002 | Davidson et al. |
| 6,411,077 B1 | 6/2002 | Sone et al. |
| 6,429,661 B1 | 8/2002 | Schweitzer, Jr. |
| 6,492,800 B1 | 12/2002 | Woods et al. |
| 6,496,265 B1 | 12/2002 | Duncan et al. |
| 6,507,184 B1 | 1/2003 | Elston |
| 6,534,977 B1 | 3/2003 | Duncan et al. |
| 6,630,819 B2 | 10/2003 | Lanagan et al. |
| 6,670,810 B2 | 12/2003 | Duncan et al. |
| 6,680,662 B2 | 1/2004 | Schauwecker et al. |
| 6,756,781 B2 | 6/2004 | Duncan et al. |
| 6,774,639 B1 | 8/2004 | Unsworth |
| 6,876,480 B2 | 4/2005 | Sahashi et al. |
| 6,946,827 B2 | 9/2005 | Rahmatian et al. |
| 7,057,792 B2 | 6/2006 | Kadogawa et al. |
| 7,068,025 B2 | 6/2006 | Bjorn |
| 7,239,400 B2 * | 7/2007 | Bock et al. ............ 356/614 |
| 7,466,118 B2 * | 12/2008 | Bjorn ..................... 324/74 |
| 7,633,285 B2 | 12/2009 | Rahmatian et al. |
| 7,646,192 B2 | 1/2010 | Bjorn |
| 7,769,250 B2 | 8/2010 | Duvillaret et al. |
| 8,525,512 B2 | 9/2013 | Sorensen |
| 8,558,535 B2 | 10/2013 | Sorensen |
| 2003/0117126 A1 | 6/2003 | Rahmatian |
| 2003/0146748 A1 | 8/2003 | Duncan et al. |
| 2003/0229423 A1 | 12/2003 | Andarawis et al. |
| 2005/0007092 A1 | 1/2005 | Bjorn |
| 2005/0024234 A1 | 2/2005 | Brooksby et al. |
| 2005/0273183 A1 | 12/2005 | Curt et al. |
| 2006/0170410 A1 | 8/2006 | Bjorn |
| 2006/0232260 A1 | 10/2006 | Bjorn |
| 2008/0179070 A1 | 7/2008 | Gouge et al. |
| 2009/0251308 A1 | 10/2009 | Schweitzer, III et al. |

FOREIGN PATENT DOCUMENTS

| | | |
|---|---|---|
| EP | 0011110 | 5/1980 |
| EP | 0338542 | 10/1989 |
| EP | 0597404 | 5/1994 |
| EP | 1 197 773 | 4/2002 |
| GB | 1170540 | 7/1968 |
| GB | 1353543 | 5/1974 |
| GB | 2 164 146 | 3/1986 |
| JP | 57-035760 | 2/1982 |
| JP | 59-000659 | 1/1984 |
| JP | 1305365 | 12/1989 |
| JP | 03044563 | 2/1991 |
| JP | 4161860 | 6/1992 |
| JP | 07-043392 | 2/1995 |
| JP | 9257838 | 10/1997 |
| JP | 10123226 | 5/1998 |
| JP | 10124155 | 5/1998 |
| JP | 10132864 | 5/1998 |
| JP | 2005315815 | 11/2005 |
| WO | WO 94/00768 | 1/1994 |
| WO | WO 95/00768 | 1/1995 |
| WO | WO 98/13698 | 4/1998 |
| WO | WO 00/13033 | 3/2000 |
| WO | WO 2004/099798 | 11/2004 |
| WO | WO2009/138120 | 11/2009 |

OTHER PUBLICATIONS

Chavez et al.; "230kV Optical Voltage Transducer Using a Distributed Optical Electric Field Sensor System"; IEEE; 2001.

* cited by examiner

FARADAY EFFECT CURRENT SENSOR

FIELD OF THE INVENTION

The present invention relates to a sensor assembly for measuring or time resolving fast electromagnetic fields originating from for example strokes of lightning. The measured or time resolved electromagnetic fields are generated by currents flowing in an electrical conductor. The assembly according to the present invention comprises a pair of identical but oppositely arranged Faraday sensors. In addition, the present invention relates to methods and systems for stabilizing output signal from the sensors, and to methods and systems for processing signals from the sensor assembly.

BACKGROUND OF THE INVENTION

Various arrangements for measuring lightning currents have been suggested in the patent literature.

JP 07043392 discloses a Faraday sensor facilitating measurements of lightning currents by measuring the angle of rotation of linearly polarised light propagating in a magnetic field which is generated by the lightning current.

The Faraday sensor suggested in JP 07043392 comprises a light emitting device from which light is launched into an optical fibre, a rod lens and a rectangular parallelepiped polarizer so as to produce linearly polarized light. The linearly polarized light impinges on a rectangular parallelepiped magneto-optical field sensor which rotates the plane of polarization of the measuring light by an angle $\beta$ under influence of the magnetic field. The rotational angle $\beta$ is converted into an intensity of light by means of a rectangular parallelepiped analyzer disposed on the output side of a magneto-optical element. After having left the magneto-optical element the light passes through a rod lens and an optical fibre before reaching and being detected by means of an E/O converter, such as for example a photodiode.

It is a disadvantage of the Faraday sensor suggested in JP 07043392 that external magnetic fields, i.e. magnetic fields other that the magnetic field generated by the lightning current, may easily influence measurements performed by the sensor suggested in JP 07043392. Since the Faraday sensor suggested in JP 07043392 is sensitive to non-lightning related magnetic fields correct determination of the lightning current may be difficult, if not impossible.

It is an object of the present invention to provide a sensor assembly which is insensitive to external and thereby disturbing magnetic fields. By external and disturbing magnetic fields are meant magnetic fields other than the magnetic fields generated by the conductor carrying the current to be measured.

It is further object of the present invention to provide a sensor assembly incorporating a compensation method and an associated compensation arrangement for compensating for aging of the optical components forming the sensor assembly.

It is a still further object of the present invention to provide a signal processing method and an associated signal processing arrangement for processing signals from the sensor assembly.

SUMMARY OF THE INVENTION

The above-mentioned objects are complied with by providing, in a first aspect, a Faraday sensor assembly comprising a first light guiding element adapted to guide electromagnetic radiation along a first propagation direction, a second light guiding element adapted to guide electromagnetic radiation along a second propagation direction, and a measurement region adapted to receive an electrically conducting element having, in the measurement region, its primary extension direction in a direction being essentially perpendicular to the first and second propagation directions.

The sensor assembly according to the present invention is capable of measuring currents, such as lightning currents, up to +/−400 kA in a 0.2 Hz-10 MHz frequency range. By selectively analyzing the sensor signal in specific frequency ranges, for example in the frequency range below 1 kHz, currents as small as 50-60 A may be determined. In addition, the sensor assembly according to this first aspect is capable of operating in temperature intervals bridging −30° C. to +70° C. In terms of reproducibility of a given sensor assembly the measurement accuracy of the assembly is within a 2%.

The second propagation direction may be essentially oppositely arranged relative to the first propagation direction. The measurement region may in principle be arranged arbitrarily relative to the first and second light guiding elements. However, the measurement region is preferably arranged between the first and second light guiding elements so that the first light guiding element, a conducting element arranged in the measurement region and the second light guiding element form a sandwich-like construction in combination. The electrically conducting element may be implemented in various ways. Thus, the electrically conducting element may comprise an electrically conducting wire, a substantially rigid rod, a construction part of a rotor blade etc.

The sensor assembly according to the present invention may further comprise input polarisation elements adapted to polarise electromagnetic radiation coupled into each of the first and second light guiding elements. In addition, the Faraday sensor assembly according to the present invention may further comprise output polarisation elements adapted to polarise electromagnetic radiation coupled out of each of the first and second light guiding elements, Polarisation directions of the input polarisation elements may be differently arranged compared to respective ones of polarisation directions of the output polarisation elements. Preferably, the polarisation directions of an associated pair of input and output polarisation elements are differently arranged by an angle of approximately 45 degrees.

The first light guiding element may, in a first embodiment, be arranged within a first housing comprising an inwardly curved outer housing portion adapted to face an electrically conducting element positioned in the measurement region. Similarly, the second light guiding element may be arranged within a second housing comprising an inwardly curved outer housing portion adapted to face an electrically conducting element positioned in the measurement region. Thus, the inwardly curved outer housing portions of the first and second housings may define, in combination, the boundaries of the measurement region.

Each of the first and second housings may comprise outer attaching surface portions, wherein outer attaching surface portions of the first housing abut outer attaching surface portions of the second housing.

The first and second light guiding elements may each comprise an optically transparent rod, such as a glass rod.

The first and second light guiding elements may be supported by a first and a second inner box, respectively, and wherein each of the first and second inner boxes comprises a through-going opening adapted to receive a light guiding element.

In a second embodiment, the first light guiding element may be arranged within a first housing comprising a first and a second part, said first and second housing parts comprising corresponding sets of alignment elements to secure proper alignment of the first and second housing parts. Similarly, the second light guiding element may be arranged within a second housing comprising a first and a second part, said first and second housing parts comprising corresponding sets of alignment elements to secure proper alignment of the first and second housing parts.

The first and second housings may comprise one or more through-going openings adapted to receive one or more fixation elements so as to establish a fixed relationship between the first and second housings.

In order to form a measurement region between the first and second housings the Faraday sensor assembly may further comprise one or more distance elements arranged between the first and second housings, the one or more distance elements being aligned with at least one of the one or more through-going openings. Thus, by aligning a distance elements with a through-going opening of the first housing and a through-going opening of the second housing a fixation element, such as a bolt, may be positioned so that it penetrates the first and second housings and a distance element. Obviously, a plurality of distance elements may be applied.

In order to guide light to and from the first and second light guiding elements the first and second housings may comprise integrated supporting channels adapted to support for example optical fibres. The dimensions of these integrated supporting channels may be arranged to match the outer dimensions of such optical fibres. The supporting channels of each housing may form part of the alignment elements used to ensure proper alignment of the housing parts of each of the first and second housing.

In wind turbine applications suitable positions of sensor assemblies according to the first aspect of the present invention are in the rotor blades of the wind turbine and/or at or near the highest point of the tower of the wind turbine. The latter position may be at or near the weather station at the top of the nacelle.

The Verdet constants of the first and second light guiding elements may be essentially the same, such as approximately 0.022 min/G-cm. Alternatively, the Verdet constants of the first and second light guiding elements may be different in that a ratio between the Verdet constants of the first and second light guiding elements may be higher than 2, such as higher than 5, such as higher than 10, such as higher than 20.

In a second aspect, the present invention relates to a compensation arrangement for a Faraday sensor adapted to measure a current, such as a lightning current, flowing in a conductor, the compensation arrangement comprising means for providing essentially linearly polarised electromagnetic radiation, said means comprising a light emitting device,
means for guiding the provided electromagnetic radiation in a magnetic field,
means for detecting electromagnetic radiation leaving the guiding means, and converting the detected electromagnetic radiation to an electrical signal, and
electronic control means for comparing the electrical signal to a reference signal, the electronic control means further being adapted to generate a control signal in response to this comparison and providing the generated control signal to the light emitting device in order to control an emitted intensity of light from the light emitting device.

The means for providing essentially linearly polarised electromagnetic radiation may further comprise a polarisation filter adapted to convert incoming electromagnetic radiation to essentially linearly polarised electromagnetic radiation. The light emitting device may comprise a light emitting diode.

The means for detecting electromagnetic radiation leaving the guiding means may comprise a detector sensitive to electromagnetic radiation and a polarisation filter for polarising electromagnetic radiation leaving the guiding means, whereas the light guiding means may comprise an optically transparent rod, such as a glass rod.

The electronic control means may comprise an amplifier circuit adapted to receive the electrical signal from the detecting means, an amplifier circuit adapted to generate an output signal from the compensation arrangement, a filter circuit for filtering the output signal, and a power generator adapted to receive the filtered output signal and generate the control signal to the light emitting device in order to control the emitted intensity of light. The filter circuit may comprise a low-pass filter having a predetermined cut off frequency.

The electronic control means may further comprise means for varying the level of the reference signal that is to be compared to the electrical signal. The means for varying the level of the reference signal may be capable of varying the level of the reference signal in a substantially continuous manner. The means for varying the level of the reference signal may comprise a potentiometer.

In a third aspect, the present invention relates to a compensation method for a Faraday sensor adapted to measure a current, such as a lightning current, flowing in a conductor, the method comprising the steps of providing essentially linearly polarised electromagnetic radiation, said electro-magnetic radiation being generated by a light emitting device,
coupling the essentially linearly polarised electromagnetic radiation into guiding means adapted to guide the electromagnetic radiation in a magnetic field,
detecting electromagnetic radiation leaving the guiding means and converting the detected electromagnetic radiation to an electrical signal, and
comparing the electrical signal to a reference signal, generating a control signal in response to this comparison and providing the generated control signal to the light emitting device in order to control an emitted intensity of light from the light emitting device.

The essentially linearly polarised electromagnetic radiation may be provided by applying a polarisation filter adapted to convert incoming electromagnetic radiation to essentially linearly polarised electromagnetic radiation. The light emitting device may comprise a light emitting diode.

The electromagnetic radiation leaving the guiding means may be detected by applying a detector sensitive to electromagnetic radiation. Preferably, the electromagnetic radiation leaving the guiding means passes a polarisation filter prior to being detected by the detector.

As mentioned in connection with the second aspect of the present invention, the light guiding means may comprise an optically transparent rod, such as a glass rod.

The comparison between electrical signal and the reference signal may be performed by applying electronic control means comprising a transimpedance circuit adapted to receive the electrical signal from the detecting means, an amplifier circuit adapted to generate an output signal from the compensation arrangement, a filter circuit for filtering the output signal, and a power generator adapted to receive the filtered output signal and generate the control signal to the light emitting device in order to control the emitted intensity of light.

The filter circuit may comprise a low-pass filter having a predetermined cut off frequency.

The electronic control means may further comprise means for varying the level of the reference signal that is to be compared to the electrical signal. The means for varying the level of the reference signal may be capable of varying the level of the reference signal in a substantially continuous manner. The means for varying the level of the reference signal may comprise a potentiometer.

In a fourth aspect, the present invention relates to an electronic noise reduction method for a Faraday sensor adapted to measure a current, such as a lightning current, flowing in a conductor, the method comprising the steps of providing a first and a second time domain signal, the first and second time domain signals originating from respective ones of first and second measurements of a given property of a measurable electrical signal, converting the first and second time domain signals to first and second frequency domain signals, respectively, multiplying said first and second frequency domain signals to form an intermediate frequency domain signal, filtrating the intermediate frequency domain signal in accordance with a first trigger level, said first trigger level being set as a percentage of a maximum amplitude in the intermediate frequency domain signal, and filtrating the intermediate frequency domain signal in accordance with a second trigger level by removing frequency components above said second trigger level, combining the filtrated intermediate frequency domain signal with a combined frequency domain signal of the first and second frequency domain signals so as to form a final frequency domain signal, and converting the final frequency domain signal to a final time domain signal.

The advantage of the method according to the fourth aspect of the present invention is that it essentially eliminates to influence of the following typical noise sources:

Optical noise in the detection circuit
Electrical noise in the light source and amplifiers
Interference from magnetic fields from nearby inductors and system (e.g. a transformer)
Interference from the magnetic field created by the light stroke
Sensor production tolerances
Vibrations of the sensor
Temperature effect on the Verdet constant
Temperature effect on the light source and detector
The light source and the detector degradation over lifetime
The decreasing in performance of the optical fibers All the above-mentioned elements potentially contribute to noise in the system and thereby contribute to errors in the measured signal.

The step of converting the first and second time domain signals to first and second frequency domain signals, respectively, may comprise a step of performing a Discrete Fourier Transformation (DFT) of the first and second time domain signals prior to multiplying the first and second frequency domain signals.

The step of combining the filtrated intermediate frequency domain signal with the combined frequency domain signal of the first and second frequency domain signals may comprise the step of calculating an average signal of the first and second frequency domain signals, and multiply said average signal with the filtrated intermediate frequency domain signal.

The step of converting the final frequency domain signal to the final time domain signal may comprise a step of performing an Inverse Discrete Fourier Transformation (IDFT) of the final frequency domain signal.

The second trigger level may be within the range 100 kHz-10 MHz, such as within the range 500 kHz-8 MHz, such as within the range 500 kHz-5 MHz, such as within the range 500 kHz-3 MHz, such as approximately 1 MHz.

In a fifth aspect, the present invention relates to an electronic noise reduction arrangement for a Faraday sensor adapted to measure a current, such as a lightning current, flowing in a conductor, the arrangement comprising means for providing a first and a second time domain signal, the first and second time domain signals originating from respective ones of first and second measurements of a given property of a measurable electrical signal, means for converting the first and second time domain signals to first and second frequency domain signals, respectively, means for multiplying said first and second frequency domain signals so as to form an intermediate frequency domain signal, means for filtrating the intermediate frequency domain signal in accordance with a first trigger level, said first trigger level being set as a percentage of a maximum amplitude in the intermediate frequency domain signal, means for filtrating the intermediate frequency domain signal in accordance with a second trigger level by removing frequency components above said second trigger level, means for combining the filtrated intermediate frequency domain signal with a combined signal of the first and second frequency domain signals so as to form a final frequency domain signal, and means for converting the final frequency domain signal to a final time domain signal.

The first and second means for providing the first and second time domain signals, respectively, may comprise a pair of Faraday sensors. The pair of Faraday sensors may be arranged so as to guide polarised electromagnetic radiation in light guiding elements arranged on opposite sites of a current carrying conductor.

The first and second time domain signals may be converted to first and second frequency domain signals, respectively, by performing a Discrete Fourier Transformation (DFT) of the first and second time domain signal.

The filtrated intermediate frequency domain signal may be combined with the combined frequency domain signal of the first and second frequency domain signals by calculating an average signal of the first and second frequency domain signals, and multiply said average signal with the filtrated intermediate frequency domain signal.

The final frequency domain signal may be converted to the final time domain signal by performing an Inverse Discrete Fourier Transformation (IDFT) of the final frequency domain signal. The second trigger level may be within the range 100 kHz-10 MHz, such as within the range 500 kHz-8 MHz, such as within the range 500 kHz-5 MHz, such as within the range 500 kHz-3 MHz, such as approximately 1 MHz.

In a sixth and final aspect the present invention relates to a method for measuring a current using a Faraday sensor assembly, the method comprising the steps of providing a first light guiding element adapted to guide electromagnetic radiation along a first propagation direction, providing a second light guiding element adapted to guide electromagnetic radiation along a second propagation direction, positioning an electrically conducting element in a measurement region of the Faraday sensor assembly, the primary extension direction of the electrically conducting element being essentially perpendicular to the first and second propagation directions, and determining Faraday rotations of electromagnetic radiation propagating in the first and second light guiding elements.

The Verdet constants of the first and second light guiding elements may be essentially the same, such as approximately 0.022 min/G-cm. Alternatively, the Verdet constants of the first and second light guiding elements may be different in that a ratio between the Verdet constants of the first and second light guiding elements may be higher than 2, such as higher than 5, such as higher than 10, such as higher than 20.

In terms of implementation the Faraday sensor assembly according to the sixth aspect of the present invention may be implemented following the design rules suggested in connection with the first aspect of the present invention.

BRIEF DESCRIPTION OF THE DRAWINGS

The present invention will now be described in further details with reference to the accompanying figures, wherein.

Figure 1:
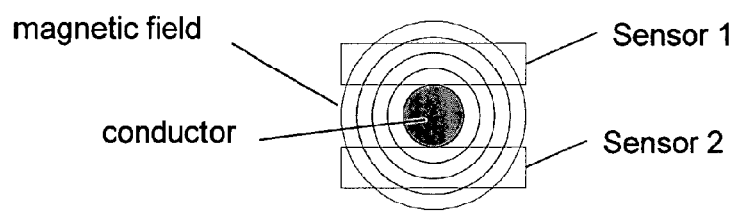
FIGS. 1a and 1b show the positioning of two sensors in a preferred embodiment of the present invention and a block diagram of a system with a DSP.
Figure 1:
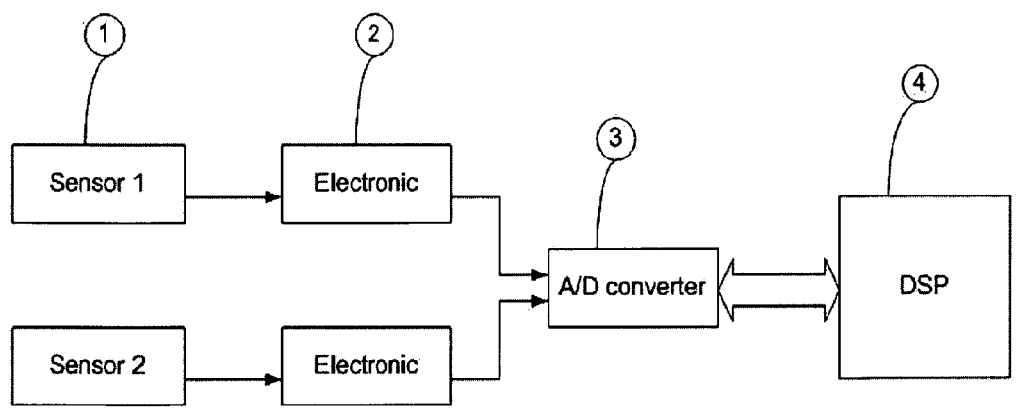

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE INVENTION

In its most general concept, the present invention relates to a sensor arrangement comprising a pair of essentially oppositely arranged Faraday sensors. By oppositely is meant that two beams of electromagnetic radiation are guided in essentially opposite propagation directions in a magnetic field generated by an electrically conducting element. The two beams of electromagnetic radiation are guided by a pair of transparent elements, such as glass rods, arranged on opposite sides of the electrically conducting element. As previously stated, the electrically conducting element may be implemented as an electrically conducting wire, a substantially rigid rod, a construction part of a rotor blade etc. The present invention further relates to noise filtration and DC compensation techniques. The individual aspects of the present invention will be described independently in the following sections.

Noise Filtration

Wherever sensors are used there is a need to filtrate noise from sensor signals. In one aspect the present invention relates to a method whereby noise can be removed from a signal by use of a DSP (Digital Signal Processor). The signal needs to be cleaned before the actual analysis can begin and the measurement can be utilized for the intended purpose.

FIGS. 1a and 1b illustrate the first aspect of the present invention. As depicted in FIG. 1a sensor 1 and sensor 2 are arranged on opposite sides of the conductor. The magnetic field generated by the conductor is illustrated by the concentrically arranged rings, The sensor 1 provides a signal via an electronic subsystem 2, where the signal is amplified, to an A/D converter 3 where the analog signal is transferred to a digital signal. The digital signal from the A/D converter 3 is provided to the DSP 4 where a calculation is performed and the noise is removed from the signal.

Figure 2:
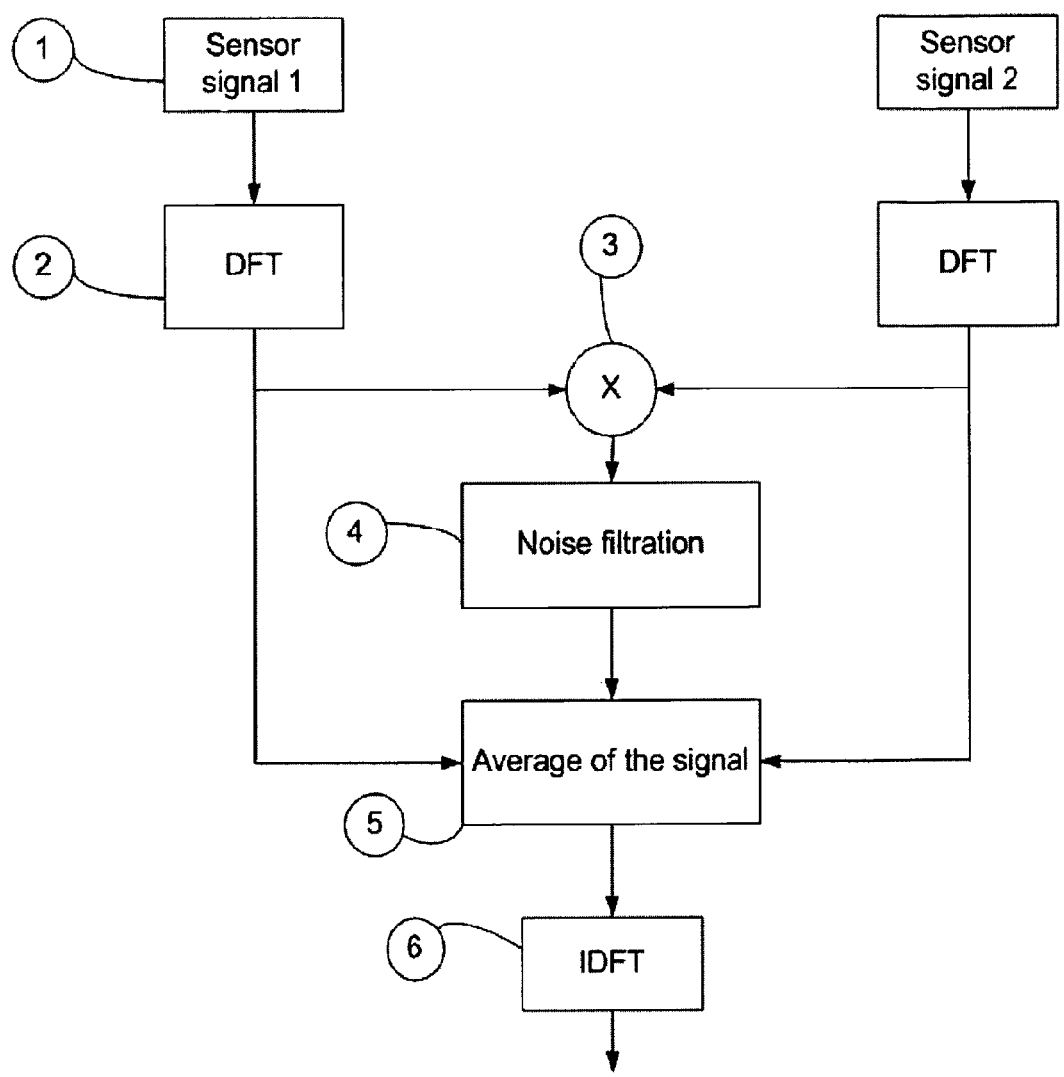
FIG. 2 shows a block diagram of the DSP.

An operational system consists of two sensors 1 as shown in FIG. 1. The two sensors are measuring on the same media, such a on a power line. Therefore, the measured signals have the same frequency characterization whereas deviations in the amplitude values due to tolerances in the production of the sensors may exist. When the signal is passing through the electronic subsystem 2 a considerably amount of white noise is generated and added to the signal as a result of the amplifiers work. This white noise is undesired because it reduces the overall quality of the signal. The digital signal from the A/D converter 3 is loaded in the DSP and noise is removed via 6 steps as indicated in FIG. 2. As indicated in FIG. 2 step number 1 involves the loading of the digital sensor signals to the DSP.

Step number 2 is a Discrete Fourier Transformation (DFT) of each of the signals. This means that the signals are converted from the time domain to the frequency domain. Step number 3 involves calculation of the product of the two DFT's. Step number 4 involves analyzing the product of the two DFT signals. Step number 5 involves calculation of the average of the two DFT signals and multiplying the averaged signal with the resulting signal from step 4. The 6th and final step involves an Inverse Discrete Fourier Transformation (IDFT) whereby the frequency domain signal is converted to a final time domain signal. Now the process is finished and the noise has been significantly reduced from the signal.

Figure 3:
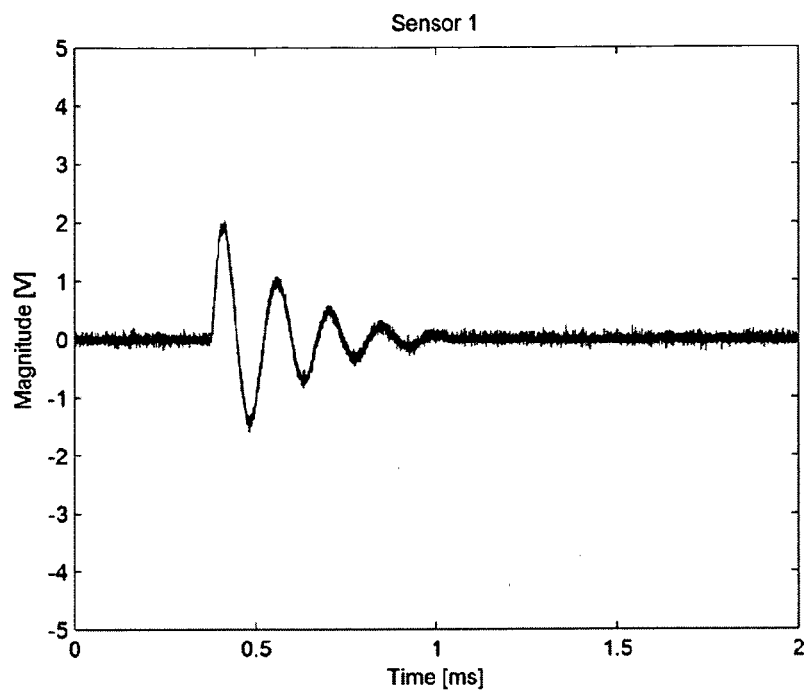
FIG. 3 shows a signal from sensor 1.
Figure 4:
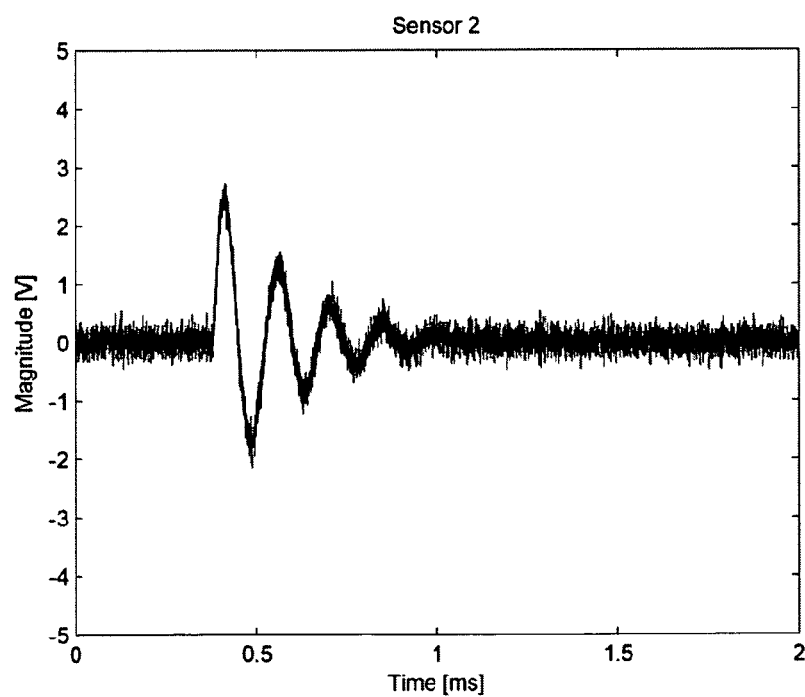
FIG. 4 shows a signal from sensor 2.
Figure 5:
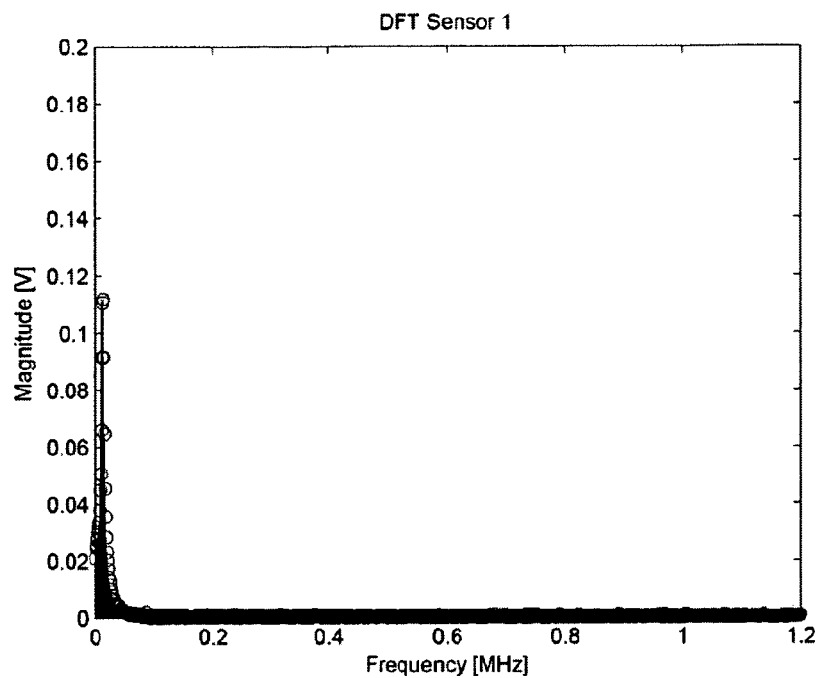
FIG. 5 shows a signal from sensor 1 after DFT.
Figure 6:
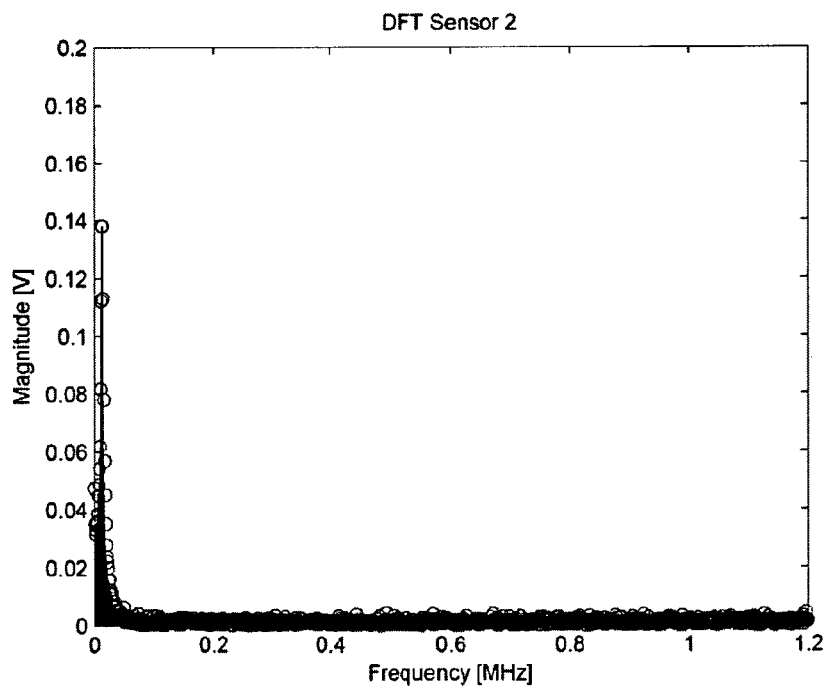
FIG. 6 shows a signal from sensor 2 after DFT.

As mentioned above the signal loaded into the DSP undergoes a Discrete Fourier Transformation (DFT) where the signals are transferred from the time domain to the frequency domain. Also as earlier mentioned, the frequency characterization is identical for the two sensors—see FIGS. 3 and 4. However, the amplitudes are different which is in accordance with the condition specified previously. This has the advantaged that the frequency components become visible via a magnitude-frequency plot.

Figure 7:
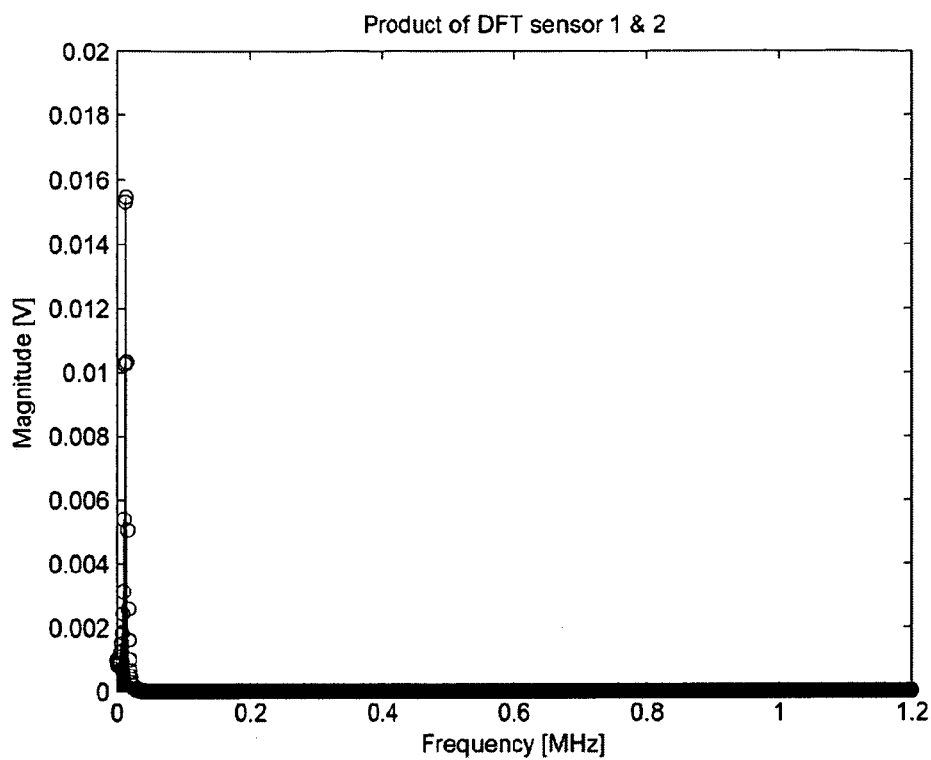
FIG. 7 shows the product of the DFTs from sensor 1 and sensor 2.

The frequency spectrum of the signals from sensor 1 and 2 is then multiplied. By multiplying the two signals the noise part and signal part are moved away from each other in the graph as illustrated in FIG. 7.

Until now no filtration of the noise from the signal has been performed. The above-mentioned steps only relate to preliminary manoeuvres to the actual noise filtration. The real noise filtration is performed on the signal shown in FIG. 7, which is the product of the DFT signals from sensor 1 and sensor 2. The aim of the analysis is to determine the desired signal part and the noise part. The analysis involves 4 steps as listed below:

1) The frequency spectrum of the product of the DFT signals from the two sensors is analysed with the purpose of identifying the frequency component having the highest amplitude. This analysis is performed because it is most likely certain that the highest amplitude is a part of the desired signal.
2) A trigger level (X %) is defined. The trigger level varies from application to application and it is defined as a percentage of the highest frequency component. If the signal is below the trigger level it is considered as noise. Thus, everything below the trigger level is removed. It is very important to set the trigger level with care because if the trigger level is set too high part of the desired signal may be lost. Similarly, if the trigger level is to low too much noise will be present in the signal.
3) All frequencies above 10 MHz, such as above 5 MHz, such as above 3 MHz, such as above 1 MHz, such as above 0.5 MHz, are considered as noise. These frequency components are therefore removed through the filtration.
4) The frequency spectrum is once again analysed but this time with the purpose to set the frequency components to 0 or 1 using the formula below. The components which are set to 1 represent the signal.

$$\text{Noise filtration}(k) = \begin{cases} 1, & \text{if the product of } S1S2_{DFT}(k) \geq \\ & \text{Max amplitude} \cdot X \text{ \% and } k < 1 \text{ MHz} \\ 0, & \text{otherwise} \end{cases}$$

Figure 8:
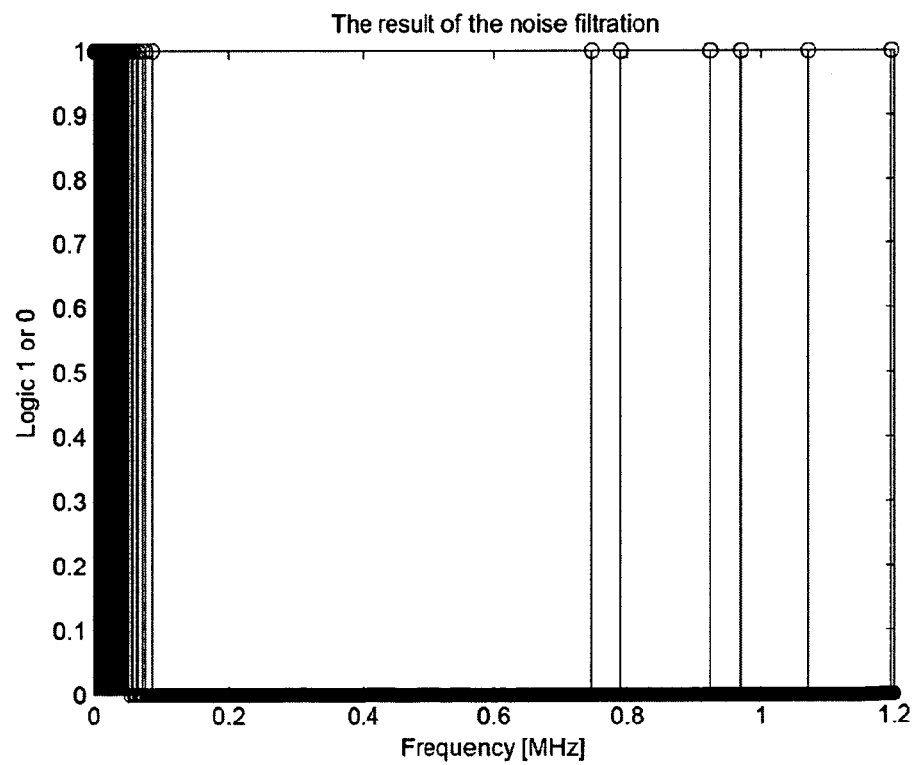
FIG. 8 shows the result of the noise filtration.

In FIG. 8 the signal has been assigned the value 1 whereas the noise has been assigned the value 0, i.e. the noise has been isolated on the frequency axis. Thus the signal and the noise are now separated from each other.

Now all the preliminary work is done and the desired signal can be produced by calculating the average of the signals from the 2 sensors and multiply this signal with the noise filtration.

$$\text{Average } S1S2_{DFT}(k) = \frac{S1_{DFT}(k) + S2_{DFT}(k)}{2} \cdot \text{Noise filtration}(k)$$

Figure 9:
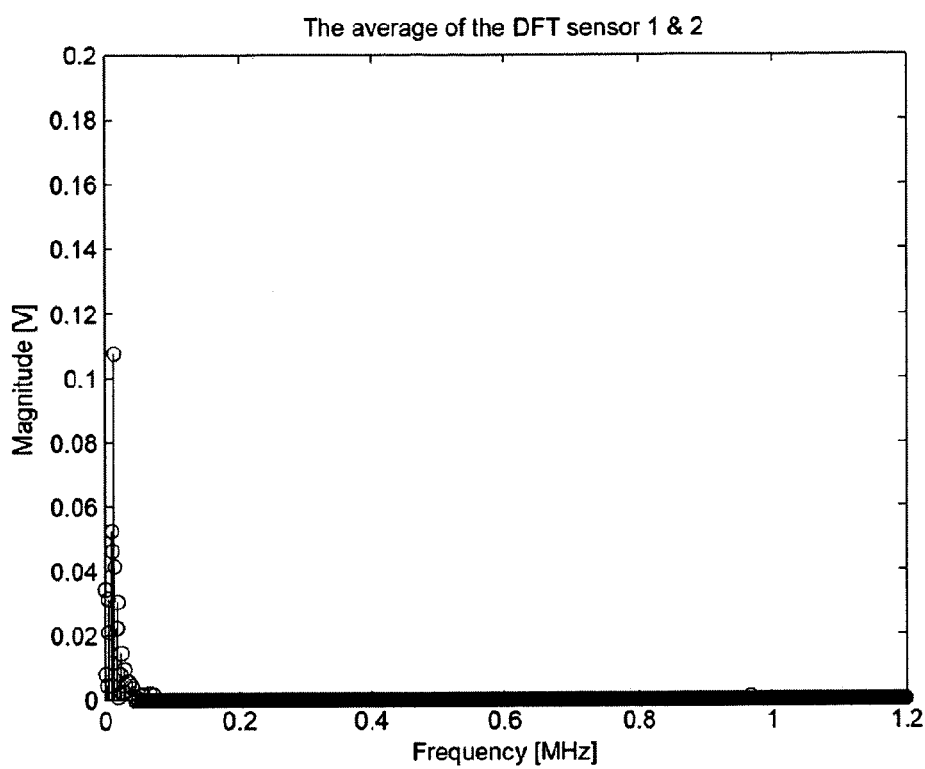
FIG. 9 shows the frequency spectrum of the desired signal.

The result from this equation is the desired signal and can be seen in FIG. 9.

Figure 10:
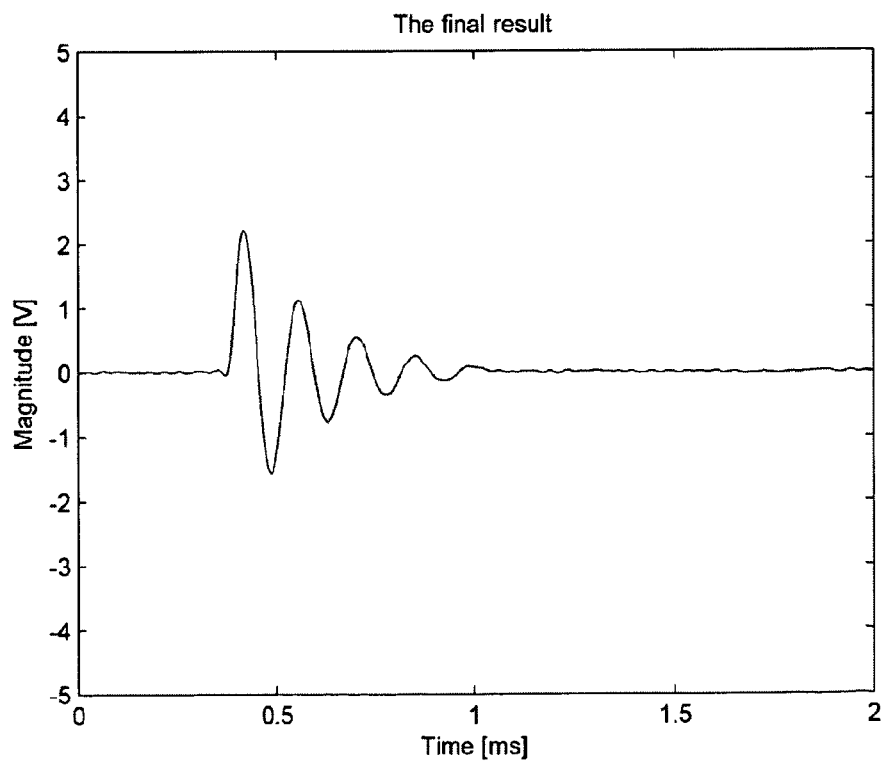
FIG. 10 shows the desired signal in the time domain.

Before the result of the noise filtration can be evaluated it is necessary to convert the signal of FIG. 9 to the time domain using an Inverse Discrete Fourier Transformation (IDFT). The result of this transformation is shown in FIG. 10.

When the untreated signal from the 2 sensors (FIGS. 3 and 4) and the treated signal (FIG. 10) are compared it is clear that the noise filtration process has succeeded. Essentially all the noise has been removed from the initial signal. The final signal is a highly useful signal that can be used for different kinds of analysis where noise filtration is a relevant issue. For example, when a lightning hits a wind turbine or a telephone distribution mast the method according to the present invention can be used to determine the characteristic of the lightning.

The noise filtration method according to the present invention is essentially immune to outer influences, such as for example temperature. Thus, the noise filtration method according to the present invention essentially eliminates outer influences which are affecting the performance of the sensor including its components, such as light diode, light receiving unit and DC compensator.

DC Compensation

The present invention further relates to a DC compensator which can be used together with a Faraday sensor to measure magnetic fields in electrical systems. The system which comprises a sensor including various electronic components (see a more detailed description later in this paragraph) can be used to measure e.g. stroke of lightning in a wind turbine, a mobile telephone distribution mast, a TV mast or a current flowing in a power line. The DC compensator according to the present invention differs from conventional systems in that the DC compensator according to the present invention applies electrical components instead of optical components. This means that the DC compensator according to the present invention is less expensive compared to known products available on the market today.

Figure 11:
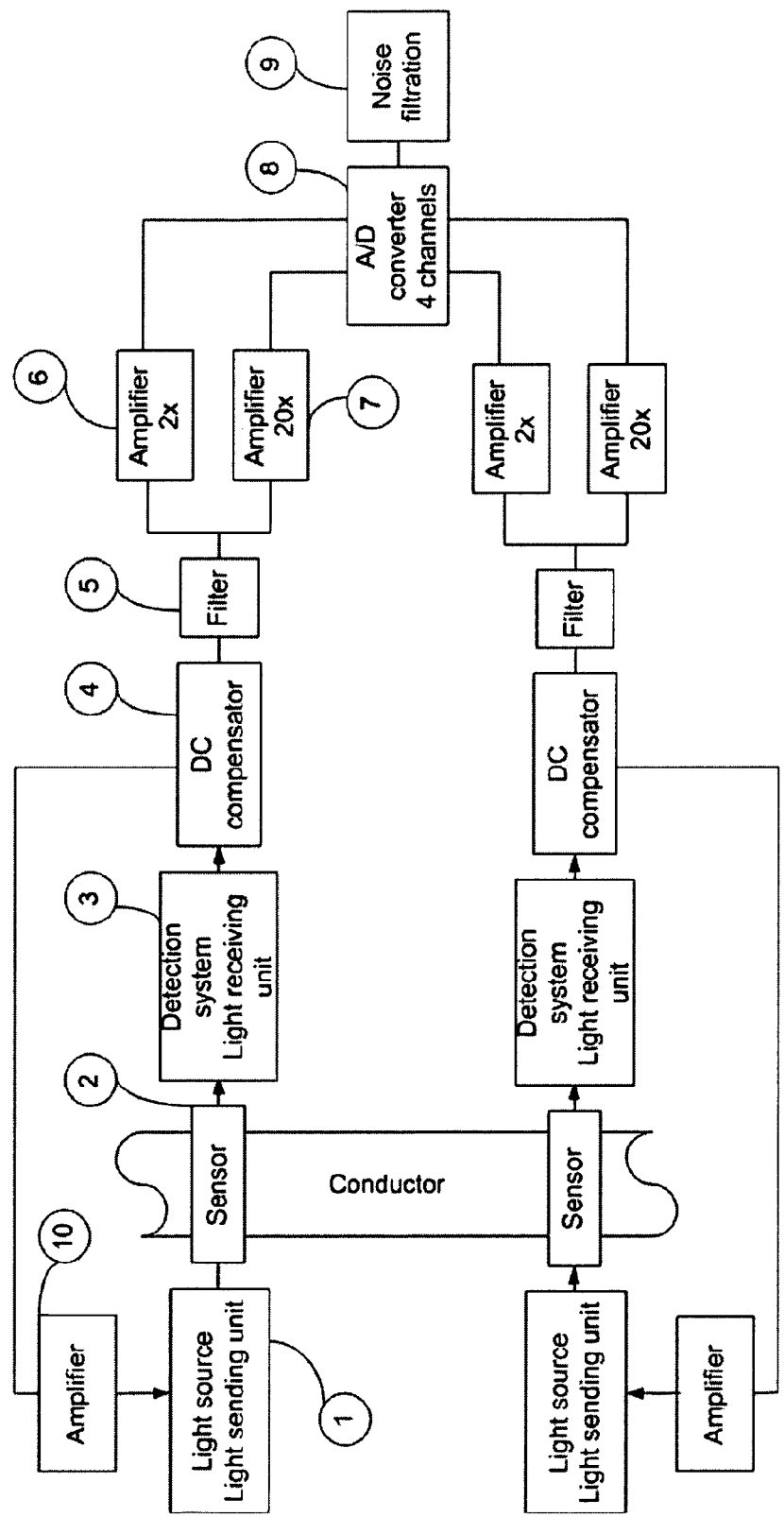
FIG. 11 shows a block diagram of the full system.

Referring now to FIG. 11 a measuring device for measuring magnetic fields in electrical systems involves an optical sensor 2 placed on or near the conductor. The optical sensor 2 is operatively connected to light source 1 and detector system/light receiving unit 3 via optical fibers. From the detector system/light receiving unit 3 the measured signal is feed to the DC compensator 4 and the output from the DC compensator 4 is send back in a feedback loop via an power generator 10 and into the light source 1. The light source 1 can be a light emitting diode (LED) emitting light in the red region, such as for example at around 630 nm. The intensity of the emitted light may be adjusted to match specific applications. A light intensity of around 3-5 mW, measured at the output of a 5-10 cm long optical fiber, would be an appropriate light intensity for most applications. To achieve such light intensity a driving current of 300-400 mA needs to be provided to the LED.

The output from the DC compensator 4 is also feed to a filter 5 and the output from the filter is distributed to two amplifiers 6, 7. Each of amplifiers 6, 7 provides an output signal which is feed into a four channel A/D converter 8. In FIG. 11 amplifiers 6 and 7 amplify the signal from the filter 5 twice and twenty times, respectively. These amplification levels may be chosen differently. Alternatively, the entire or only part of the amplification may be incorporated into the A/D converter 8. The digital signal is feed to the noise filtration system 9.

An operational system consists of two sensor systems (1, 2, 3, 4, 5, 6, 7, 8, 9, 10) where the A/D converter 8 is operated as a collector for the signals from the two sensors.

The operational system uses two identical sensors. The two sensors are performing the same measurement. Thus, two measurements of the same phenomena comprise the same frequency characteristic. However, even though the frequency characteristics are the same the amplitudes may be different as a result of tolerances in the sensor.

The DC compensator 4 ensures that a constant signal level is provided from system/light receiving unit 3. This is done with the help of the feedback loop from the DC compensator 4 via the power generator 10 to the light source 1. The DC compensator is compensating for changes in temperature and the decrease in efficiency of the light diode and the system/light receiving unit 3. The system is calibrated on the production site of the wind turbine. This is done by adjusting a potentiometer or another adjustable component—see reference numeral 17a in FIGS. 12 and 13. To calibrate the system it is necessary to send a known current through the system and then adjust the potentiometer so that the current in test point is equal to zero.

The DC compensator ensures a stable signal level input into the filter 5 (see FIG. 11) disregarding the decreasing efficiency for the light diode over time or other changes. If for example the current over the light diode is kept constant, the light level will decrease over time due to loss in efficiency over time. With time the signal feed to the detecting system/light receiving unit becomes useless because the ratio between the noise and the signal becomes too small. Therefore, over time it becomes difficult to remove the noise from the signal. This means that the system no longer can be used and therefore have to be replaced.

The lifetime of the system can be extended if the signal/noise ratio can be kept constant. Thus, if the signal level to the filter 5 is stable at a reasonable level the lifetime of the system can be increased. This is ensured by the DC compensator. Due to the DC compensator the current, over the light diode, is dynamic. The DC compensator does not remove the noise from the signal but it ensures a constant noise/signal ratio so that the noise can be removed later by the noise filtrating unit.

Figure 12:
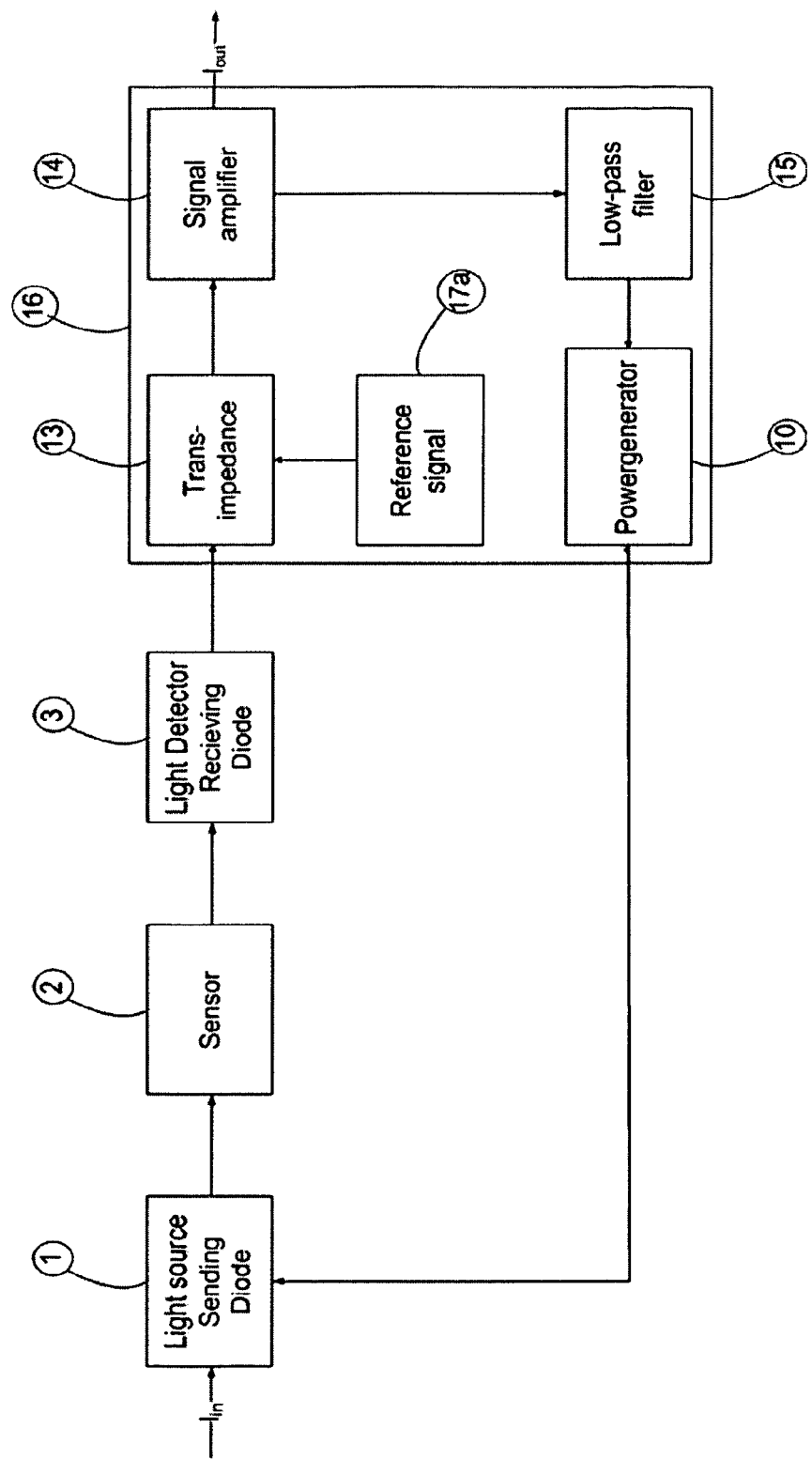
FIG. 12 shows a block diagram of the DC compensator.
Figure 13:
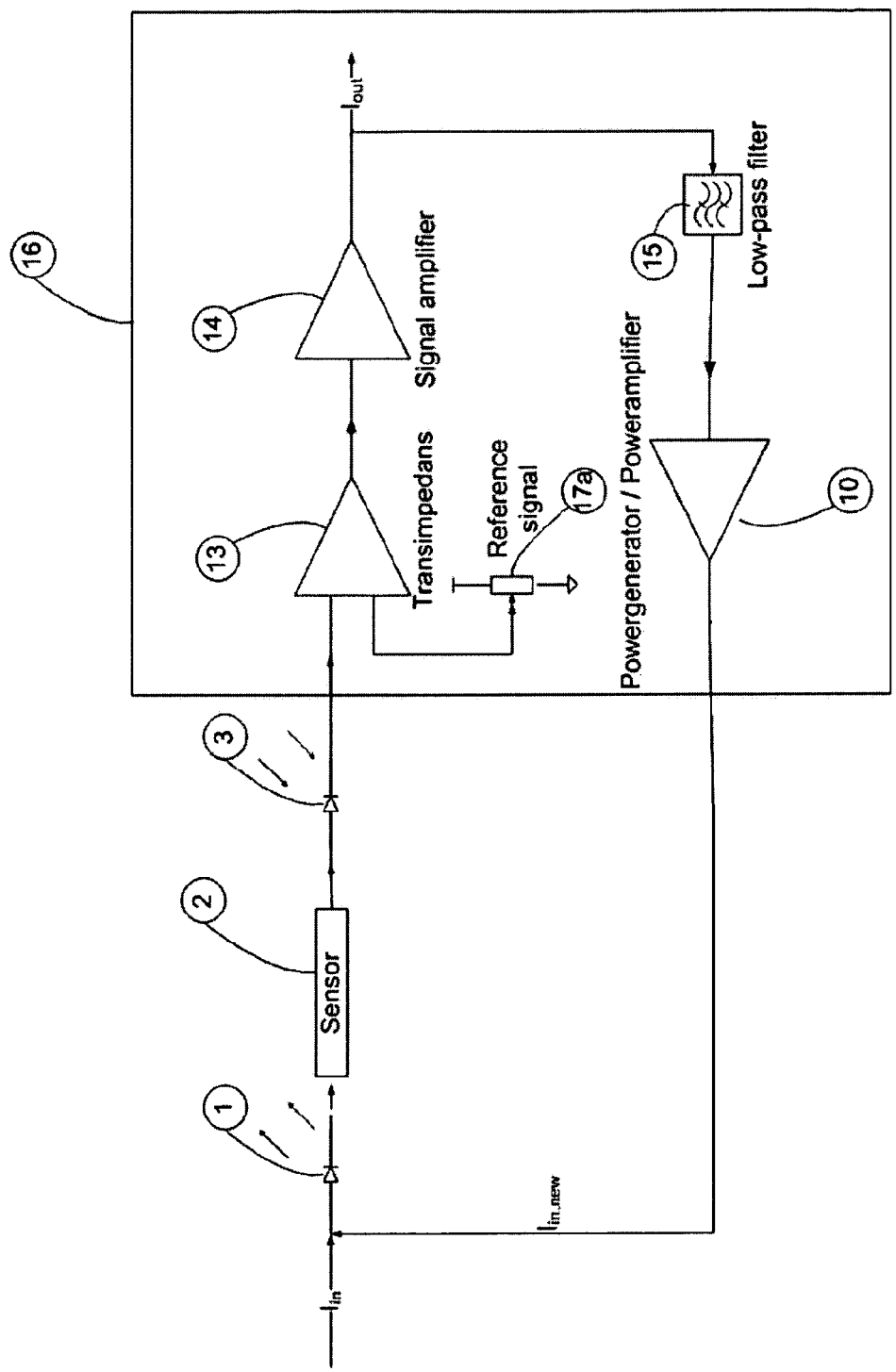
FIG. 13 shows a block diagram of the DC compensator with the use of standard symbols.

The DC compensator shown in FIGS. 12 and 13 uses the change in the direct current to define the feedback. When the system is switched on a known current level is provided to the light source 1. The generated signal level (light intensity and current) decreases through the fiber optics, the sensor 2 and the light receiver 3.

FIGS. 12 and 13 are two different kinds of ways to illustrate the build-up of the DC compensator 16. The DC compensator is build-up of a transimpedance amplifier 13 which is receiving an input from the detection system/light receiving unit. The transimpedance amplifier 13 is followed by a signal amplifier 14 which is sending its output signal out of the DC compensator but also back to the light source 1 via the feedback loop with the low-pass filter 15 and the power generator 10.

The DC compensator compares the output from the light receiving unit 3 with a reference value given by a potentiometer. The difference between the input to the impedance amplifier 13 and the reference value is send to the signal amplifier 14 and back into the feedback loop. This means that if the difference is positive (the input is larger than the reference value) the input current to the light source 1 is increased. If the difference is negative the input current to the light source 1 will decrease.

Via the low-pass filter the alternating current (AC) is removed and only the direct current is passing through the filter. The power generator is ensuring that the light emitting diode is not provided with a current which is too high with the risk of damaging the light emitting diode.

Figure 14:
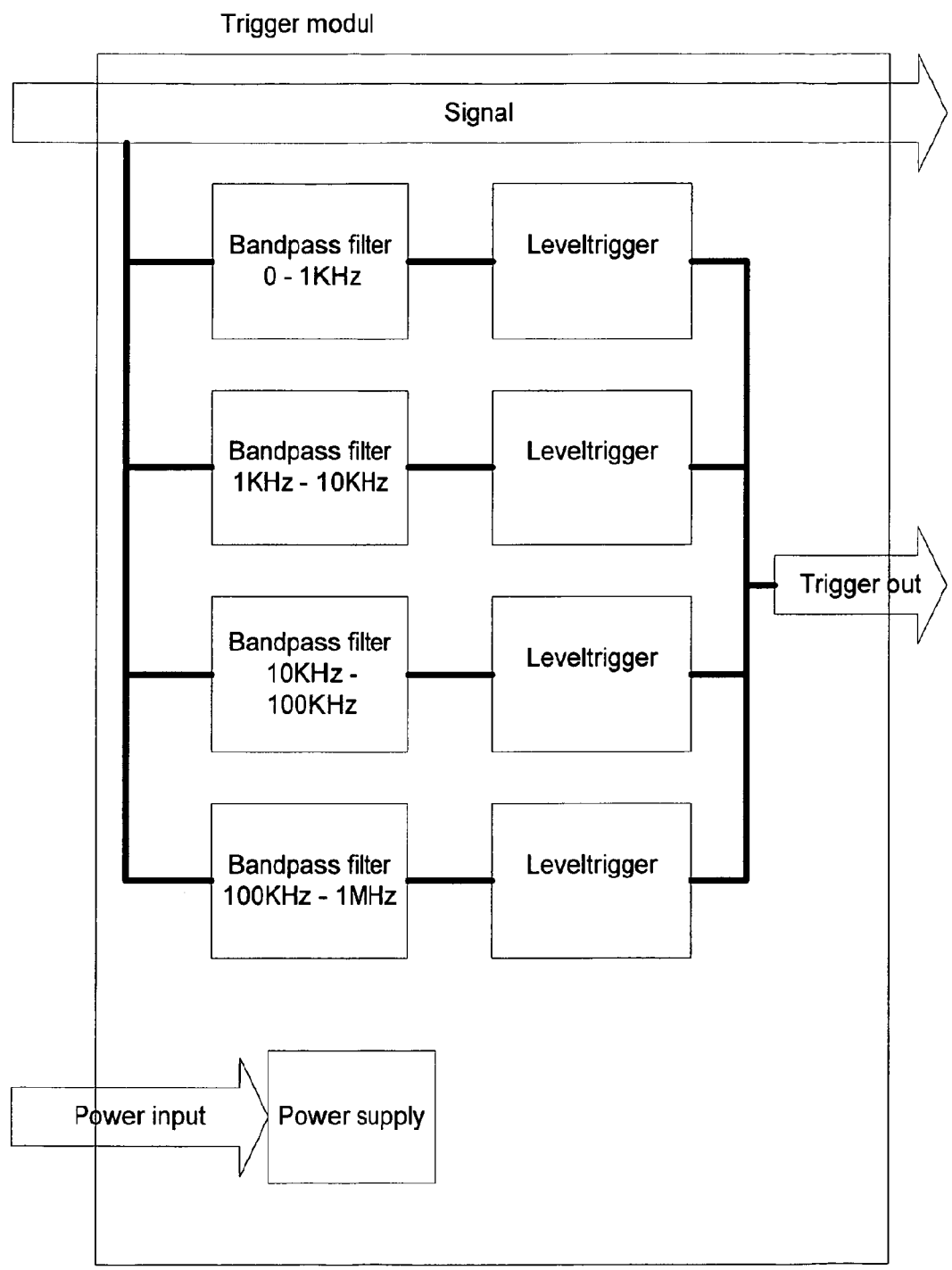
FIG. 14 shows a block diagram of the trigger module.
Figure 15:
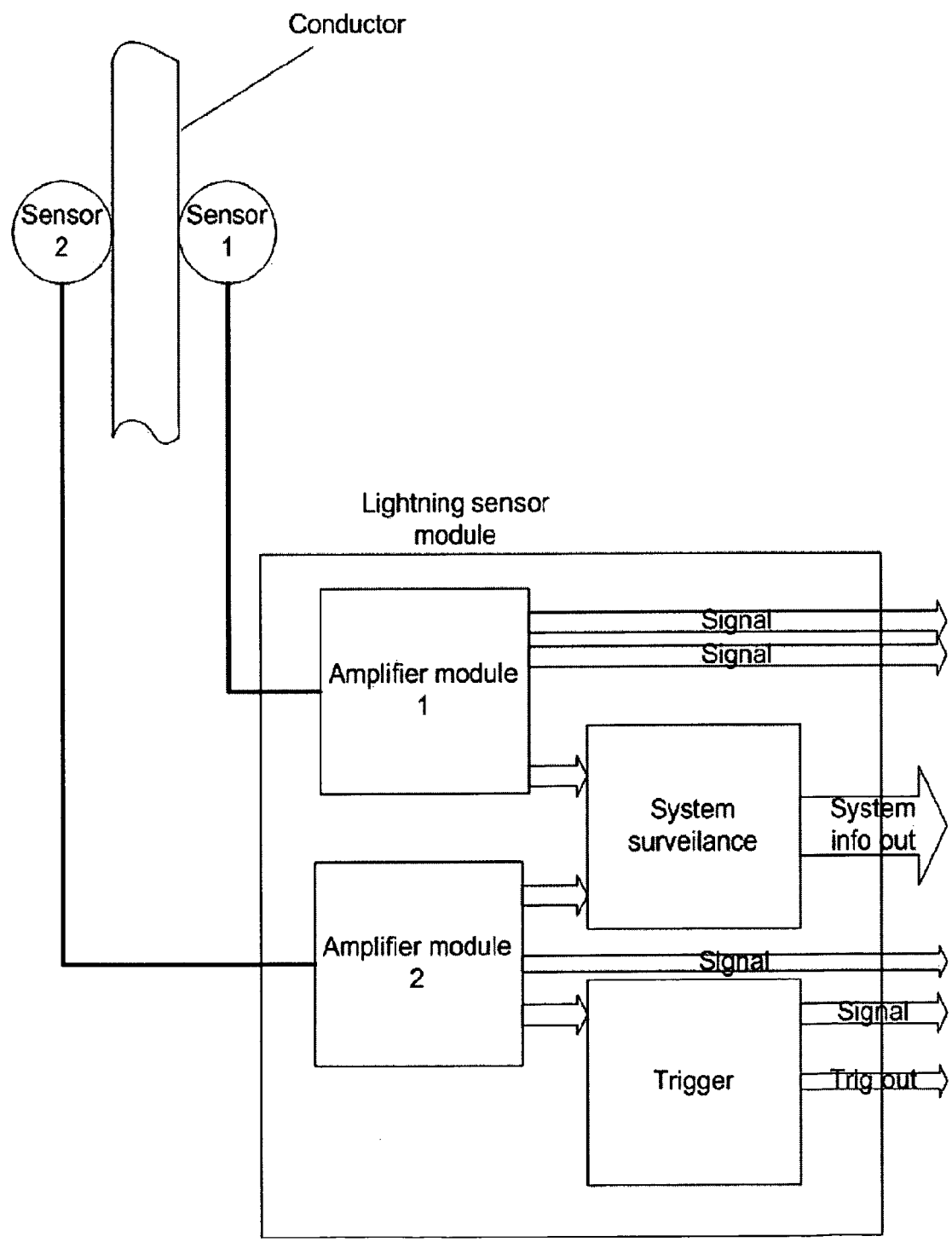
FIG. 15 shows an overall block diagram of the signal path in the sensor assembly according to the present invention module.

The dynamic range of the sensor assembly according to the present invention can be increased by introducing an analogue trigger module comprising a plurality of band-pass filters. A block diagram of the trigger module is depicted in FIG. 14. As seen the trigger module comprises band-pass filters with the following frequency range: 0-1 KHz, 1-10 kHz, 10-100 kHz and 100 kHz-1 MHz. Each of these frequency ranges may be individually selected to that only signal in the selected frequency range is analyzed. By applying the trigger module and selectively analyzing the output signals from the band-pass filters, current levels as low as 50-60 A can be detected. FIG. 15 illustrates to positioning of the trigger module in the overall signal path of the sensor assembly.

Faraday Sensor

The entire sensor system is intended for measuring electromagnetic fields caused by high currents. This is done by providing a fibre-optic sensor with polar metric detection. In a faraday effect current sensor the polarization plane of a polarized incident light undergoes a rotation which is a function of the magnetic field created by the electrical current to be measured. The current to be measured can be determined by measuring the angle of rotation of the polarization plane of the light output of the optical sensor. The sensor system has to be able to withstand weather elements including high wind speeds without affecting the measurements from the sensor system. Temperature ranges from minus 30 degrees Celsius to 70 degrees Celsius must also be complied with.

Figure 16:
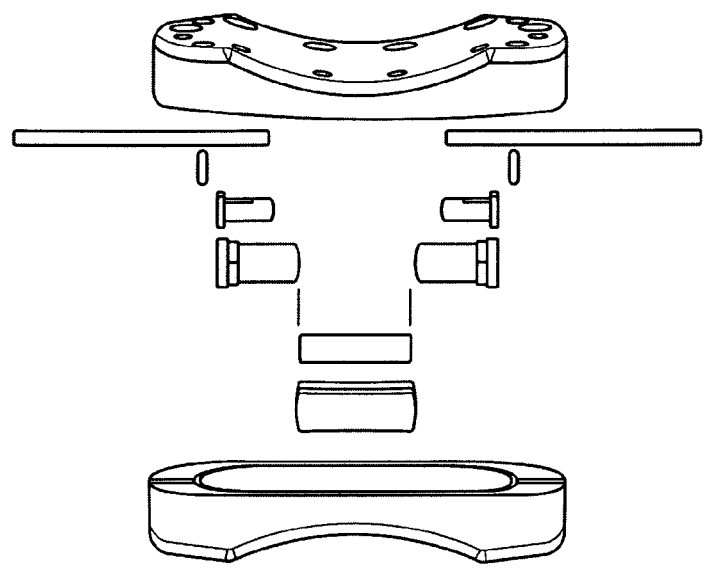
FIG. 16 shows a first embodiment of a sensor of a sensor system according to the present invention.

A sensor system comprises two identical but oppositely arranged sensors. A sensor forming part of a sensor system according to the present invention is depicted in FIG. 16. As seen in FIG. 16 a sensor comprises an upper 1 and a lower 2 part which are adapted to be bolted together. Two fiber-optic cables 3, 4 ensure that light can enter and leave the sensor. The fiber-optic cables are kept in position by two O-rings 5, 6 and two fiber enclosures 7, 8. The fiber enclosures are adapted to be inserted into the lens housings 9, 10 which also incorporate a lens for effectively coupling light in and out of a glass rod 11. The glass rod 11 is kept in position by an inner housing 12 which also ensures proper alignment of the glass rod 11 and two polarization filters 13, 14. Each of the individual components will be described in further details below.

When the sensor house is assembled with the fibre-optic cable and the two sensor housing parts are bolted together the sensor assembly is fully functional. However, since the sensor must be capable of withstanding extreme weather conditions and measuring high voltages additional protection is required.

When a lightning strikes it produces a shockwave which is affecting the surroundings near the place of impact. Because the sensor is mounted near this place the entire sensor is affected by the shockwave. The measurements from the sensor are sensitive to vibrations whereby the sensor will generate a false signal in response to the shockwave. Therefore it is very important to make sure that the sensor and the associated fibre-optic cables are affected as little as possible by for example shockwaves.

The sensor must also be capable of withstanding forces of 15G. To comply with this the entire sensor including fibre-optic cables are moulded into a mass of silicone. The silicone thus protects the sensor. The silicone ensures that the sensor is protected against extreme weather conditions and it is also protecting the sensor from ultra violent light. The silicone mass is a two component mass and it is preferably mixed in a 4:1 weight ratio into a moulding form.

The moulding form ensures that the components are placed correctly before the silicone is mixed into the form. The form is treated with Vaseline or another kind of grease so that when the silicone is hardened the silicone mass can easily be removed from the form.

Figure 17:
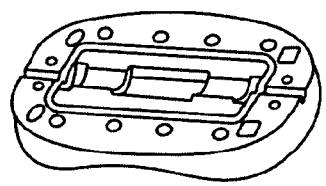
FIG. 17 depicts a housing part.

FIG. 17 shows a part of the sensor housing. The sensor house part of FIG. 17 is designed to hold all the sensor components. In addition the sensor housing part of FIG. 17 keeps the various sensor components in a fixed and correct relationship relative to each other. Finally, the sensor housing part of FIG. 17 also eases assembling of the sensor components thereby reducing misassembling of the sensor.

As depicted in FIG. 16, the sensor housing consists of two identical parts. The sensor housing is made of black polyethylene. The dark colour makes the sensor housing resistant to ultra violet light. Even though the silicone moulding around the sensor housing is also resisting to ultra violet light the sensor housing is still visible and therefore not protected by the silicone at the positions where fibre-optic cables are attached to the housing.

To keep particles out of the sensor a tongue and groove connection is provided around all of the internal sensor parts. The tolerances are making the fit tight and because the polyethylene is a relatively soft material the polyethylene makes the connection water and particle proof. Around the fibre-optic cables two silicone rings keep the assembly waterproof. The two parts are screwed together with nylon bolts. The length of the thread should be 6.50 mm and 12.50 mm. The bolts are made of nylon so that they do not interfere with the magnetic field like convention metal bolts will do. The nylon bolts also prevents damaging of the thread in the sensor housing if these are tightened too much.

Figure 18:
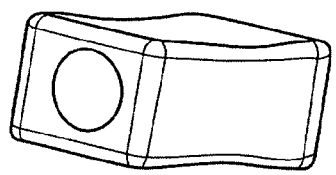
FIG. 18 depicts an inner box for holding the glass rod and polarization filters.

FIG. 18 depicts an inner box for holding the glass rod and polarization filters. The main idea with this part is to make sure that the filters are hold correctly in place. First of all, the filters have to completely cover both ends of the glass rod. It is very important that the filters are not squeezed when assembled because this may change the function and give a false reading. The holder also have to keep the glass rod align with the other components for maximum light throughput.

The holder of FIG. 18 is made of polyethylene because it must have the same temperature expansion as the sensor housing. Thus, when the whole sensor is exposed to large temperatures variations the holder and the sensor housing remain in a fixed relationship.

Figure 19:
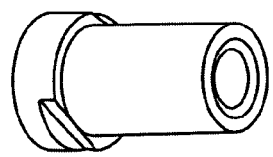
FIG. 19 shows a lens housing including a lens for coupling light in and out of the glass rod.

FIG. 19 shows a lens housing including a lens for coupling light in and out of the glass rod. The lens ensures minimum loss of light whereby as much light as possible is allowed to pass through the sensor. The lens also ensures that the diameter of the light beam in the glass rod can be as large as possible. This will affect the rotation of the light inside the glass rod caused by a magnetic field. The larger diameter of the light beam the more rotation can be achieved. The lens housing also holds the fibre-optic cable firmly in place. The lens itself consists of a convex lens positioned just after the fibre-optic cable. The lens is made of PMMA-Polymethacrylat (acrylic).

Figure 20:
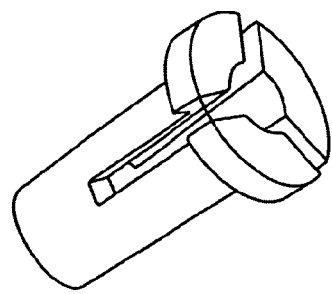
FIG. 20 shows a fibre-optic enclosure adapted to be inserted into the lens housing.

FIG. 20 shows a fibre-optic enclosure adapted to be inserted into the lens housing. The fibre-optic enclosure also ensures a proper grip around the optic-fibre cable. The fibre-optic enclosure ensures that the fibre-optic cable is placed correctly in front of the lens and that it is firmly in place. The lens and the fibre-optic enclosure are produced together. The fibre-optic enclosure is pressed into the lens with the fibre-optic cable and tightens the grip around the fibre-optic cable. The fibre-optic enclosure is made of ABS (AcryInitril-Butadien-Styren).

Figure 21:
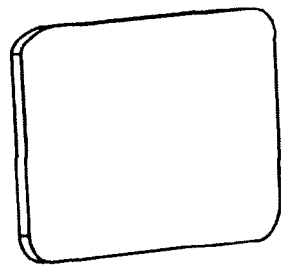
FIG. 21 shows a polarisation filter.

FIG. 21 shows a polarisation filter. In the sensor a polarisation filter is position at each end of the glass rod so that light entering the glass rod passes a polarisation filter whereby light entering the glass is linearly polarised in a predetermined direction. When light leaves the glass it passes another polarisation filter which is oriented differently compared to the polarisation filter on the entry side of the glass rod.

When light travels through the first (entry) polarization filter the light is being polarized and has a certain polarization plane. This polarization plane undergoes, within the glass rod, a rotation which is caused by the magnetic field created by the electrical current. The orientation of the polarisation axis of the polarisation filter on the exit side of the glass rod is rotated 45 degrees relative to the entry polarisation filter.

The current to be measured can be determined by measuring the angle of rotation of the polarization plane of the light on output of the optical sensor. The reason why the polarisation axis of the filter on the exit side is rotated 45 degrees is to make to sensor capable of measuring both positive and negative currents. Thus, with this arrangement of the polarisation filters the sensor is capable of equally measuring high negative and positive currents. To comply with this the two filters have the same outer dimensions whereas the direction of polarization is shifted 45 degrees. Thus, when the sensor is assembled the two filters are placed in the same way on each side of the glass rod.

Figure 22:
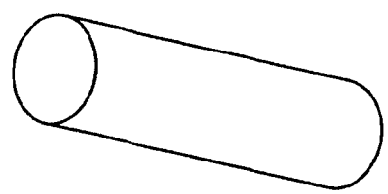
FIG. 22 shows a glass rod.

FIG. 22 shows a glass rod. The glass is positioned between the two polarisation filters. The linearly polarized light leaving the entry polarisation filter rotates, within the glass rod, when exposed to a magnetic field due to the relatively high Verdet constant of the glass rod material. The glass rod is made of the glass type BK7. The material is heat treated in order to obtain suitable properties, such as a Verdet constant of 0.022 min/G-cm.

Figure 23:
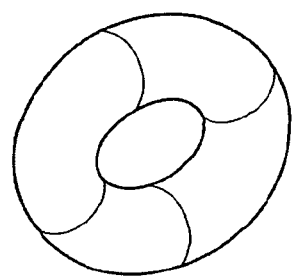
FIG. 23 shows an O-ring.

To ensure that the entire sensor house is waterproof O-rings as shown in FIG. 23 are arranged around the fibro-optic cables. The O-rings also ensures that the fibre-optic cables are hold firmly in position. Thus, the O-rings provide a sealing between the fibre-optic cable and the two parts of the sensor housing. When the to sensor house parts are assembled the O-ring seal around the fibre-optic cable because the O-ring is squeezed in place. The O-rings must be flexible, capable of withstanding ultra violet exposure and high temperatures.

Figure 24:
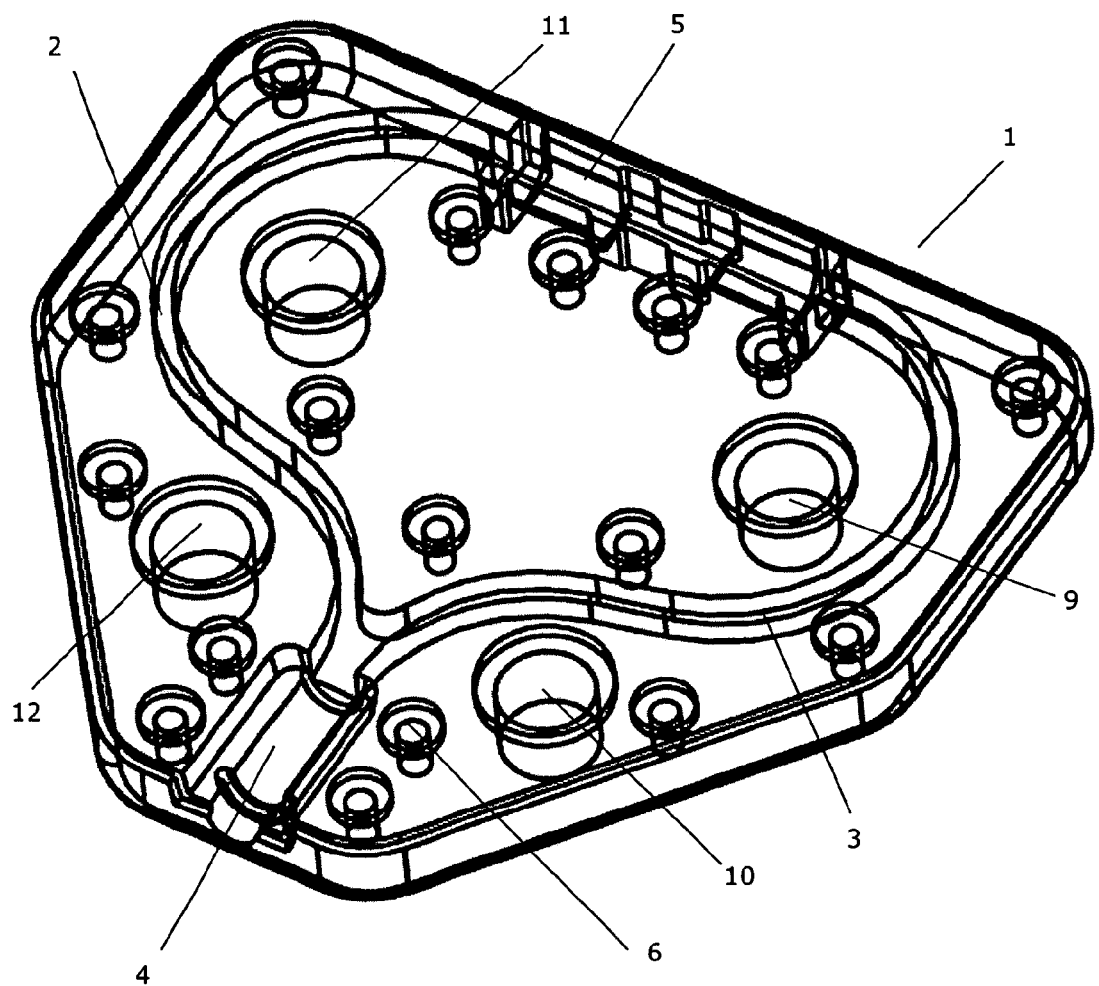
FIG. 24 shows a first part of a second embodiment of a sensor of a sensor assembly according to the present invention.
Figure 25:
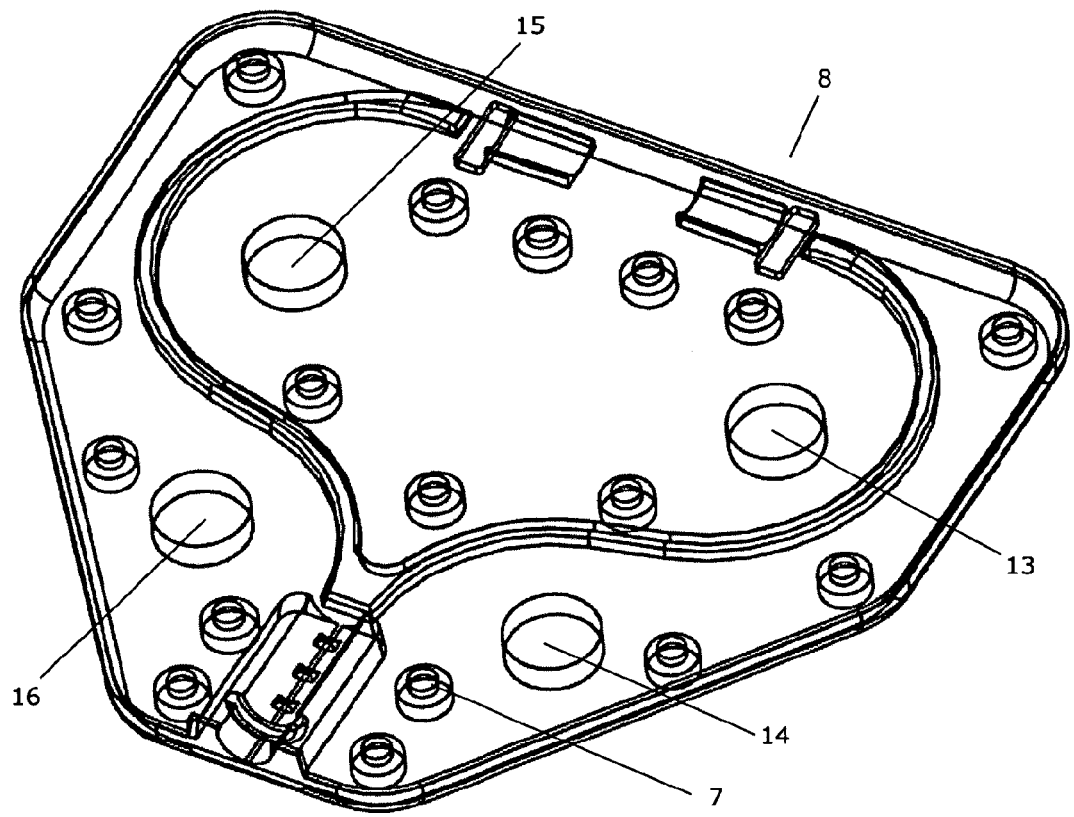
FIG. 25 shows a second part of a second embodiment of a sensor of a sensor assembly according to the present invention.

FIGS. 24 and 25 show an alternative embodiment of a sensor according to the present invention. FIG. 24 shows a bottom part 1 of the alternative embodiment, whereas FIG. 25 shows a top part 8 of the alternative embodiment, this top part being adapted to be secured to the bottom part of FIG. 24.

Referring now to FIG. 24 the bottom part comprises channels 2, 3 for supporting fibre-optic cables from an input region 4 to a measurement zone 5 where the rotation of polarisation is about to take place. As seen, the bottom part comprises a number of through-going openings 6. These through-going openings 6 are adapted to receive bolts inserted through the corresponding through-going openings 7 of the top part in order to keep the bottom part 1 and the top part 8 together. The bolts inserted through openings 7 are received by threads arranged in an inner surface of through-going openings 6.

Figure 26:
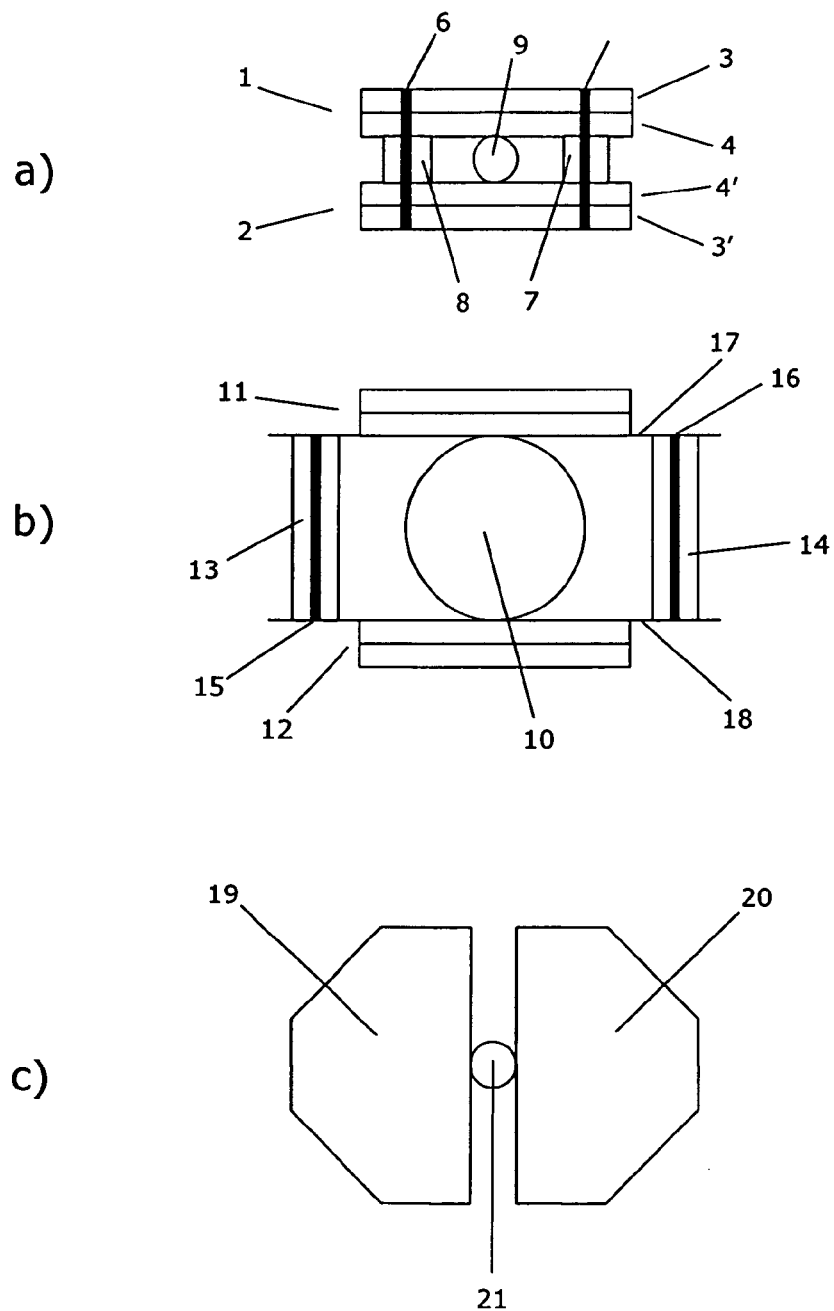
FIGS. 26a, 26b and 26c show a sensor assembly applying sensors according to the second embodiment of the present invention.

The bottom 1 and top 8 parts also contain fixation openings 9, 10, 11, 12, 13, 14, 15, 16 adapted to receive bolts (not shown) in order to keep a sensor assembly together—see FIG. 26.

Proper alignment of the bottom part 1 relative to the top part 8 is secured by projections 17, 18 of FIG. 25 which are arranged to fit into channels 2, 3 of the bottom part 1. In order to secure that an assembled sensor is water proof, o-rings (not shown) are positioned in each of the indentations around fixation openings 10, 11, 12, 13 of the bottom part 1. Similarly, o-rings are positioned in each of the indentations around through-going openings 6. Finally, a silicone sealing (not shown) is positioned along the outer edges of the bottom part 1 and top part 8. When hardened this silicone sealing provides a water proof sealing along the outer edge of an assembled sensor.

FIG. 26 shows sensor assemblies applying sensors according to the alternative embodiment of the present invention. As depicted in FIG. 26a two sensors 1, 2 each comprising a top part 3, 3' and a bottom part 4, 4' are combined to form a sensor assembly. The sensor assembly is hold together by a number of bolts 5, 6 (two bolts are depicted in FIG. 26a) which penetrate each of sensors 1, 2 and two intermediate distance pieces 7, 8. The intermediate distance pieces 7, 8 may be implemented in various ways, For example, the distance pieces may for integral parts of bottom parts 4, 4'. The distance pieces may also be implemented to fill up most of the available space between the sensors 1, 2 thereby only leaving space for the conductor 9.

Whereas FIG. 26a relates to measuring currents in relatively small conductors 9, FIG. 26b depicts how a sensor assembly may be implemented in case currents are to be measured in larger conductors 10. Again, a pair of sensors 11, 12 are sandwiched around the conductor 10 using distance pieces 13, 14 and bolts 15, 16. As seen in FIG. 26b, the sensors 11, 12 are positioned on plates 17, 18, respectively. In FIGS. 26a and 26b conductors 9, 10 are depicted as conductors with a substantially circular cross-sectional profile. However, the cross-sectional shape of the conductors 9, 10 may be different from circular.

FIG. 26c shows a different arrangement of sensors 19, 20 and conductor 21. The direction of flow of the current in FIG. 26c may be out of the paper or, alternative, into the paper. In both situations the current flow in a direction being essentially perpendicular to the plane of the paper.

The Faraday sensor assembly disclosed above is has a dynamic range from around 50 A to 400 kA. The optical gain of the two sensors of the sensor assembly are essentially identical in that the Verdet constant of the active materials (glass materials) are the same, such as 0.022 min/G-cm at a wavelength of 630 nm.

By changing the active material to a MR4-material the Verdet constant changes to 0.38 min/G-cm at a wavelength of 630 nm. A sensor applying such an active material has a ~18 times higher gain. This results in system noise floor being 18 times lower. Thus, by applying a MR4-material the noise floor of a sensor is lowered to 33 A and the dynamic range is up to 22 kA.

If the active material of only one of the sensors is replaced by a material having a Verdet constant being 10 times higher than the original material one sensor will have a dynamic range from 600 A to 400 kA, while the other sensor will have a dynamic range from 60 A to 40 kA. If such a sensor assembly is mounted around a 10 mm conductor the signals from the two sensors will be as shown in FIG. 27 if a 400 kA current pulse passes through the conductor.

Figure 27:
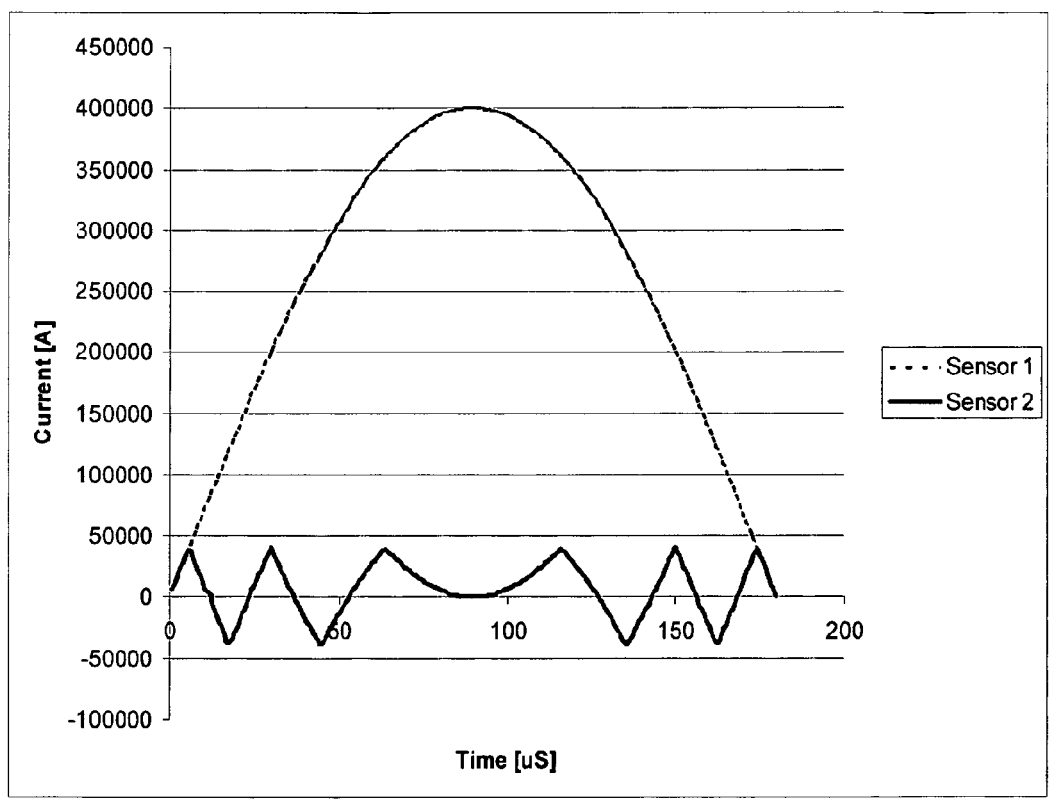
FIG. 27 shows sensor signals from two Faraday sensors having different Verdet constants.

Referring to FIG. 27 the signal from sensor 1 (low Verdet constant) goes up to 400 kA in response to a Faraday rotation of 45 degrees. For sensor 2 (high Verdet constant) the light has rotated 45 degrees when the current has reached 40 kA. At higher currents the signal from sensor 2 begins decreases until the current reaches 120 kA. When combining the two signals a high signal resolution and large dynamic range can be obtained. Thus, using for example a 12 bit A/D converter to digitize the signal, the 12 bit on sensor 1 represents a resolution of 195 A/bit. Using a similar 12 bit A/D converter on sensor 2 the resolution becomes 19 A/bit. Combining the two signals a resolution of 10×12 bit=22 bit can be obtained. Similarly, the dynamic range becomes 20 A-400 kA which is equivalent to a dynamic range of 86 dB.

Referring again to FIG. 27 the signal from sensor 2 becomes identical to the signal from sensor 1 if the sensor 2 signal is mathematically folded back. Thus, if the signal from sensor 2 is folded back a 22 bit resolution can be obtained in the full dynamic range if the sensor 1 signal is processed as indicated in table 1.

TABLE 1

| Range of sensor 1 signal [kA] | Final 22 bit signal |
| --- | --- |
| 0-40 | sensor 2 |
| 40-80 | 40 kA + (40 kA − sensor 2) |
| 80-120 | 80 kA − sensor 2 |
| 120-160 | 120 kA + (40 kA + sensor 2) |
| 160-200 | 160 kA + sensor 2 |
| 200-240 | 200 kA + (40 kA − sensor 2) |
| 240-280 | 240 kA − sensor 2 |
| 280-320 | 280 kA + (40 kA + sensor 2) |
| 320-360 | 320 kA + sensor 2 |
| 360-400 | 360 kA + (40 kA − sensor 2) |

Thus, if sensor 1 measures a current in the range 0-40 kA, the signal from sensor 2 is used. Similarly, if sensor 1 measures a current in the range 160-200 kA, a fixed value of 160 kA is added to the signal from sensor 2 in order to obtain the final result.

For negative currents the sensor 1 signal is processed as indicated in table 2.

TABLE 2

| Range of sensor 1 signal [kA] | Final 22 bit signal |
| --- | --- |
| −40-0 | sensor 2 |
| −80--40 | −40 kA + (−40 kA − sensor 2) |
| −120--820 | −80 kA − sensor 2 |
| −160--120 | −120 kA − (40 kA − sensor 2) |
| −200--160 | −160 kA − sensor 2 |
| −240--200 | −200 kA + (−40 kA − sensor 2) |
| −280--240 | −240 kA − sensor 2 |
| −320--280 | −280 kA − (40 kA − sensor 2) |
| −360--320 | −320 kA − sensor 2 |
| −400--360 | −360 kA + (−40 kA − sensor 2) |

In conclusion, the advantages of using different optical gains in the two sensors are as follows:

low trigger level of 20 A high resolution with 22 bit using a 12 bit A/D converter high dynamic range of 86 dB from 20 A-400 kA Sensor assemblies according to the present invention may for example be positioned in one or more rotor blades of a wind turbine. For example, a sensor assembly may be positioned 5-20 meters from the axis of rotation of a rotor blade. A sensor assembly positioned in a rotor blade is operatively connected to one or more lightning receptors arranged on the surface of the rotor blade. Sensor assemblies may alternatively, or in addition, be position in or near the weather station of the wind turbine.

The invention claimed is:

1. A Faraday sensor assembly, comprising:
   a first light guiding element adapted to guide electromagnetic radiation along a first propagation direction;
   a second light guiding element adapted to guide electromagnetic radiation along a second propagation direction
   a measurement region adapted to receive an electrically conducting element having, in the measurement region, its primary extension direction in a direction being essentially perpendicular to the first and second propagation directions; and
   input polarization elements adapted to polarize electromagnetic radiation coupled into each of the first and second light guiding elements.

2. A Faraday sensor assembly according to claim 1, wherein the second propagation direction is essentially oppositely arranged relative to the first propagation direction.

3. A Faraday sensor assembly according to claim 1, wherein the measurement region is arranged between the first and second light guiding elements.

4. A Faraday sensor assembly according to claim 1, further comprising output polarization elements adapted to polarize electromagnetic radiation coupled out of the first and second light guiding elements.

5. A Faraday sensor assembly according to claim 4, wherein polarization directions of the input polarization elements are differently arranged compared to respective ones of polarization of the output polarization elements.

6. A Faraday sensor assembly according to claim 5, wherein the polarization directions of an associated pair of input and output polarization elements are differently arranged by an angle approximately 45 degrees.

7. A Faraday sensor assembly according to claim 1, wherein the first light guiding element is arranged within a first housing comprising an inwardly curved outer housing portion adapted to face an electrically conducting element positioned in the measurement region.

8. A Faraday sensor assembly according to claim 7, wherein the second light guiding element is arranged within a second housing comprising an inwardly curved outer housing portion adapted to face an electrically conducting element positioned in the measurement region.

9. A Faraday sensor assembly according to claim 8, wherein the inwardly curved outer housing portions of the first and second housings define, in combination, the boundaries of the measurement region.

10. A Faraday sensor assembly according to claim 9, wherein each of the first and second housings comprises outer attaching surface portions, and wherein the outer attaching surface portions of the first housing abut the outer attaching surface portions of the second housing.

11. A Faraday sensor assembly according to claim 1, wherein the first and second light guiding elements each comprises a transparent rod.

12. A Faraday sensor assembly according to claim 1, wherein the first and second light guiding elements are supported by a first and a second inner box, respectively, and wherein each of the first and second inner boxes comprises a through-going opening adapted to receive a light guiding element.

13. A Faraday sensor assembly according to claim 1, wherein the first light guiding element is arranged within a first housing comprising a first housing part and a second housing part, said first and second housing parts comprising corresponding sets of alignment elements to secure proper alignment of the first and second housing parts.

14. A Faraday sensor assembly according to claim 13, wherein the second light guiding element is arranged within a second housing comprising a third housing part and a fourth housing part, said third and fourth housing parts comprising corresponding sets of alignment elements to secure proper alignment of the third and fourth housing parts.

15. A Faraday sensor assembly according to claim 14, wherein the first and second housings comprise one or more through-going openings adapted to receive one or more fixation elements so as to establish a fixed relationship between the first and second housings.

16. A Faraday sensor assembly according to claim 15, further comprising one or more distance elements arranged between the first and second housings, the one or more distance elements being aligned with at least one of the one or more through-going openings.

17. A Faraday sensor assembly according to claim 16, further comprising one or more fixation elements provided in the through-going openings of the first and second housings, and penetrating the one or more distance elements.

18. A Faraday sensor assembly according to claim 13, wherein the first and second housings comprise integrated supporting channels adapted to support optical fibers configured to guide light to and from the first and second light guiding elements.

19. A Faraday sensor assembly according to claim 1, wherein the Verdet constants of the first and second light guiding elements are essentially the same.

20. A Faraday sensor assembly according to claim 1, wherein the Verdet constants of the first and second light guiding elements are different.

21. A Faraday sensor assembly according to claim 20, wherein a ratio between the Verdet constants of the first and second light guiding elements is higher than 2.

* * * * *